United States Patent [19]

Liedenbaum et al.

[11] Patent Number: 5,471,490
[45] Date of Patent: Nov. 28, 1995

[54] DEVICE IN WHICH ELECTROMAGNETIC RADIATION IS RAISED IN FREQUENCY AND APPARATUS FOR OPTICALLY SCANNING AN INFORMATION PLANE, COMPRISING SUCH A DEVICE

[75] Inventors: Coen T. H. F. Liedenbaum, Eindhoven; Arnoldus L. G. J. Severens, Breda; Ronald R. Drenten; Michiel J. Jongerius, both of Eindhoven, all of Netherlands

[73] Assignee: U.S. Philips Corporation, New York, N.Y.

[21] Appl. No.: 996,215

[22] Filed: Dec. 23, 1992

[30] Foreign Application Priority Data

Dec. 30, 1991 [EP] European Pat. Off. .............. 91203426
Dec. 3, 1992 [EP] European Pat. Off. .............. 92203740

[51] Int. Cl.⁶ .............................. H01S 3/133; H01S 3/139
[52] U.S. Cl. ................. 372/32; 372/21; 372/19; 372/25; 372/22
[58] Field of Search .................. 372/21, 22, 25, 372/32, 33, 18, 43, 19, 20

[56] References Cited

U.S. PATENT DOCUMENTS

| | | | |
|---|---|---|---|
| 4,616,356 | 10/1986 | Wilkinson et al. | 369/116 |
| 5,003,549 | 3/1991 | Mitsui et al. | 372/45 |
| 5,027,361 | 6/1991 | Kozlovsky et al. | 372/22 |
| 5,038,352 | 8/1991 | Lenth et al. | 372/21 |
| 5,081,630 | 1/1992 | Lowenthal et al. | 372/20 |
| 5,185,752 | 2/1993 | Welch et al. | 372/22 |
| 5,220,572 | 6/1993 | Kawaguchi | 372/18 |
| 5,231,643 | 7/1993 | Naya et al. | 372/22 |
| 5,233,620 | 8/1993 | Shinozaki et al. | 372/20 |
| 5,237,636 | 8/1993 | Harada | 372/21 |

OTHER PUBLICATIONS

"Blue–Light Laser Ups CD Density" In Electronics Aug. 1988, p. 48.

"Second–harmonic Generation with Ga 1–x Al x As lasers and KNb3 Crystals" By P. Gunter et al. In Applied Physics Letters 35 (6), 15 Sep. 1979. pp. 461–463.

Primary Examiner—Rodney B. Bovernick
Assistant Examiner—Robert McNutt
Attorney, Agent, or Firm—David R. Treacy

[57] ABSTRACT

A doubler for a pulsed multimode laser diode. A controllable feedback loop controls the laser output such that one of the output wavelengths, or the average of two of them, fall within the acceptance bandwidth of a non-linear optical medium. Alternatively, radiation emitted from the pulsed laser is reflected over a path length such that reflected energy reenters the laser during the build-up of a following pulse.

37 Claims, 8 Drawing Sheets

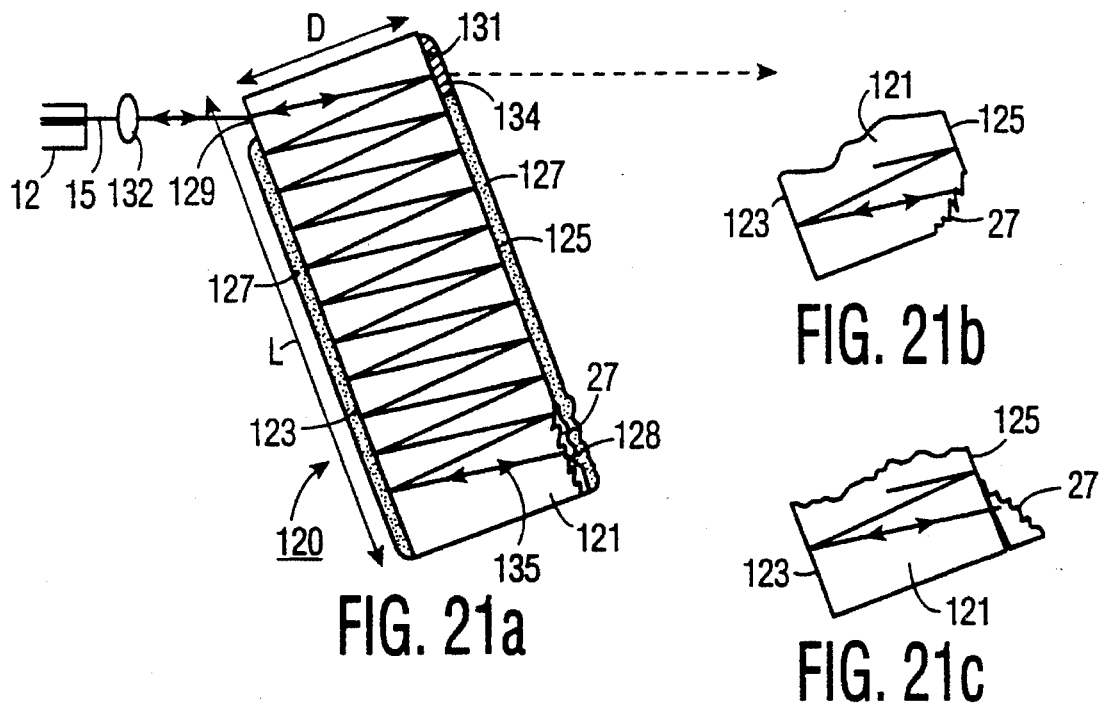
FIG. 21a
FIG. 21b
FIG. 21c
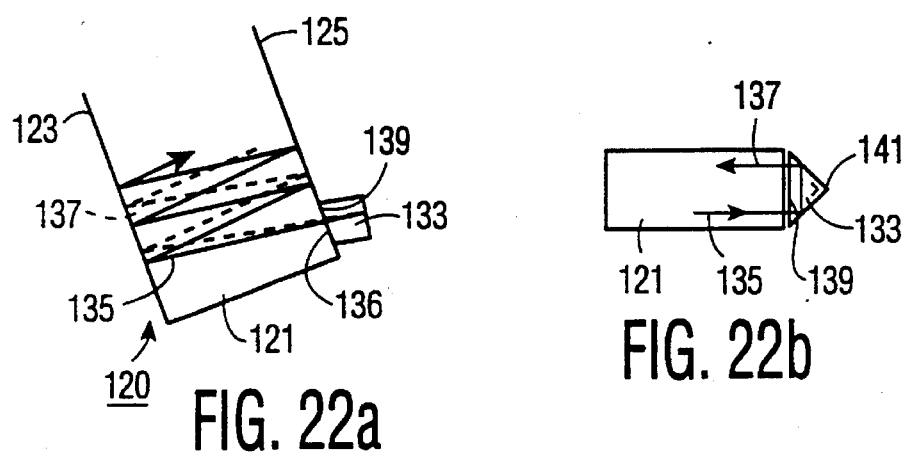
FIG. 22a
FIG. 22b
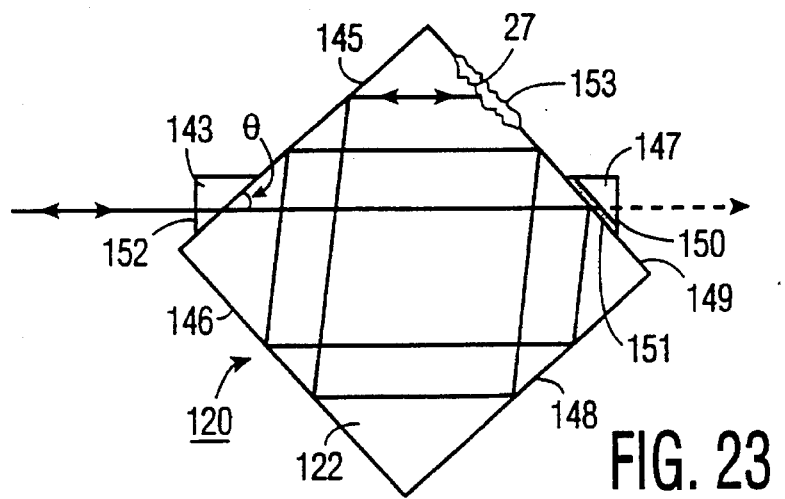
FIG. 23

DEVICE IN WHICH ELECTROMAGNETIC RADIATION IS RAISED IN FREQUENCY AND APPARATUS FOR OPTICALLY SCANNING AN INFORMATION PLANE, COMPRISING SUCH A DEVICE

CROSS-REFERENCE TO RELATED APPLICATIONS

This application is related to a concurrently-filed application by Coen Liedenbaum Ronald Drenten and Michiel Jongerius Ser. No. 07/996,214 now U.S. Pat. No. 5,333,144, for Optical Device and Apparatus for Scanning an Information Plane, Comprising Such an Optical Device.

BACKGROUND OF THE INVENTION

The invention relates to an optical device in which electromagnetic radiation is raised in frequency, which device comprises a diode laser for supplying radiation to be raised in frequency and a non-linear optical medium having an acceptance bandwidth, which medium ensures the frequency raise.

The invention also relates to an apparatus for optically scanning an information plane, comprising such a device.

The acceptance bandwidth is understood to mean the width of the wavelength band, around a nominal wavelength, of the radiation which can efficiently be raised in frequency by the non-linear optical medium.

Scanning may be understood to mean both scanning during writing and scanning during reading an information plane of, for example, an optical record carrier.

A device of the type described in the opening paragraph is known from the publication "Blue-light laser ups CD density" in "Electronics" August 1988, page 48. The device described in this publication is used in an apparatus for reading an optical record carder in which an audio program is stored. By doubling the frequency, or in other words, halving the wavelength, of the radiation of a conventional diode laser, the diameter of the read spot formed by this radiation can be halved. Consequently, information details can be read whose dimensions are half those of the information details which can be read without using frequency doubling. The frequency doubling has the great advantage that the information density in optical record carriers can be considerably increased, for example by a factor of four.

To improve the efficiency of the frequency raise, use has to be made of a relatively long non-linear optical medium. Most media have, however, a relatively small acceptance bandwidth so that relatively stringent requirements must be imposed on the diode laser in such devices. The most important requirements are:

1) The wavelength band of the radiation emitted by the diode laser is to be within the acceptance bandwidth of the non-linear optical material.

This requirement restricts the output of usable diode lasers to a considerable extent.

2) The diode laser must have a very stable emission wavelength so that this wavelength is always within the acceptance bandwidth of the non-linear optical medium. This implies that the output spectrum of the diode laser must not change.

Particularly the latter requirement may be difficult to meet in practice because both the diode laser and the non-linear optical medium must be stabilized in temperature very accurately, for example, up to 0.5° C., because both the diode laser and said medium have a strong temperature-dependent behaviour.

If temperature variations lead to a change of the output spectrum of the diode laser, giving its radiation a different wavelength, substantially no radiation with a doubled or raised frequency is emitted from the non-linear optical medium and the device has become ineffective.

SUMMARY OF THE INVENTION

The present invention has for its object to provide a device of the type described in the opening paragraph which is considerably less sensitive to temperature variations and comprises means with which a minimum required quantity of radiation having a raised frequency is invariably obtained and in which the quantity of the last-mentioned radiation can be raised considerably.

There are various embodiments of the device according to the invention, which embodiments have the common characteristic feature that the diode laser is a pulsed diode laser and in that feedback means are provided for setting the radiation supplied by the diode laser at a wavelength within the acceptance bandwidth of the nonlinear optical medium.

Combination of a diode laser emitting pulsed radiation with the feedback means provides the possibility of correcting at small deviations of the desired diode laser wavelength or of influencing the noise behaviour so that radiation having the raised frequency is invariably obtained.

A first principal embodiment of the device is characterized in that the feedback means are formed from an active control system comprising a detector which is sensitive to the frequency-raised radiation and a control unit controlled by the output signal of said detector for influencing at least one parameter determining the quantity of frequency-raised radiation.

This embodiment utilizes the fact that a pulsed diode laser is a multimode laser and emits radiation at different wavelengths. The diode laser radiation will be doubled in frequency when at least one mode is within the acceptance bandwidth of the non-linear optical medium or when the average wavelength of two simultaneously present modes is within the acceptance bandwidth. In these cases there is always frequency-raised radiation which can be detected. With reference to this detection the quantity of frequency-raised radiation can be influenced via feedback.

It is to be noted that the use of a pulsed diode laser in which the frequency is raised is known from the publication "Second-harmonic generation with $Ga_{1-x}Al_xAs$ lasers and $KNbO_3$ crystals" by P. Günter et al. in Applied Physics Letters 35 (6), 15 Sep. 1979.

However, this publication describes an experimental set-up with which the influence of temperature variations on the frequency-doubling behaviour of the combination of diode laser and non-linear optical medium is determined. A pulsed diode laser is used because such a laser can supply a higher power. The publication does not disclose the recognition that useful use can be made of the different wavelengths supplied by such a diode laser. The publication does not describe a device, applicable in practice, having a considerably reduced temperature sensitivity, but in contrast, both the diode laser and the non-linear optical medium are arranged in an oven.

Since the power in a pulsed diode laser is distributed over a number of modes, for example ten, the power of the frequency-doubled radiation is smaller than the power of this radiation which could, in principle, be obtained in a device with a continuously emitting, monomode diode laser if this device were very well stabilized in temperature. This loss of power is, however, limited because, as already noted, radiation of two laser modes whose average frequency is within the acceptance bandwidth of the non-linear optical medium is doubled in frequency, provided that said modes are simultaneously present. As is known, the power per pulse of a pulsed diode laser may be further considerably higher than the continuous power of a monomode diode laser.

In accordance with a second aspect of the present invention the power of the frequency-raised radiation can be raised considerably by using an optical instead of an opto-electronic feedback.

A second principal embodiment of the device relating to this aspect is characterized in that the feedback means are formed from optical wavelength-selective feedback means.

A part of the radiation of that mode of the diode laser radiation whose wavelength is within the acceptance bandwidth of the non-linear optical medium is fed back by the last-mentioned means. As a result, it is achieved that the pulsed diode laser will behave as a monomode laser all of whose radiation is suitable to be raised in frequency.

Due to the measure taken in the second principal embodiment the quantity of frequency-raised radiation can be increased considerably with respect to the quantity of frequency-raised radiation obtained by means of the first principal embodiment. An advantage is that the single mode is selected in another way than by changing the diode laser current and the diode laser temperature.

The second principal embodiment is preferably further characterized in that the wavelength-selective feedback means comprise an at least partially reflecting feedback element which is arranged at a distance d from the diode laser, said distance satisfying the condition $$d = \frac{c}{2} \cdot nT - \frac{c}{2} \cdot \epsilon(p + \Delta p)$$

in which p is the pulse duration of an emitted laser pulse, T is the pulse period, n is an integer, c is the light velocity in a medium traversed by the radiation beam, $\Delta p$ is the build-up time of a pulse LP in the diode laser and $\epsilon$ is a real number which satisfies $0 < \epsilon < 1$ and increases or decreases within these limits at a decreasing or increasing energy $E(P_r)$, respectively, of a radiation pulse reflected by the feedback element, so that at the instant when this radiation pulse enters the diode laser the following condition is satisfied:

$$E(P_r) > E(LP_i)$$

in which $E(LP_i)$ is the radiation energy built up in the diode laser at the relevant instant.

Due to this measure the behaviour of the diode laser is prevented from being influenced by reflections of the laser radiation on optical elements of the device or of the apparatus in which the device is used.

It is generally known that diode lasers are sensitive to laser light which returns into the active layer of the diode laser via reflections in the radiation path of the laser beam. Dependent on the quantity of returning radiation, this may give rise to unwanted effects such as an increase of the linewidth, a higher noise or a shift of the laser wavelength and hence variations in the output spectrum. It has been found that the behaviour of a pulsed diode laser is mainly determined by events occurring within the laser in the time intervals in which a new optical pulse is generated and that due to the arrival of a sufficiently large number of extra photons as a result of the feedback in exactly such a time interval these extra photons mainly determine the behaviour of the laser by adapting the energy of a reflected radiation pulse and its delay time. As a result, the diode laser can be controlled in a defined way by the deliberately provided feedback and the influence of other, unwanted feedbacks can be reduced by ensuring that the radiation pulses arrive in the diode laser at such instants as a result thereof, or, as a result of the deliberately provided feedback, have such a low intensity with respect to the pulses that they do not influence the diode laser behaviour.

The feedback element may be arranged at the same side of the diode laser as the non-linear optical element. The distance d is then the distance between the feedback element and the exit face of the diode laser. For stabilization, use may also be made of the radiation emitted from the rear face of the diode laser. The distance d is then the distance between this face and the feedback element. From the point of view of efficiency and freedom of design for optical apparatuses, the latter possibility is preferred.

A further embodiment of the device according to the invention is characterized in that the wavelength-selective feedback means comprise a grating.

A grating is a very suitable wavelength-selective element.

A further embodiment of the device according to the invention is characterized in that the grating is a holographic grating.

A further embodiment of the device according to the invention is characterized in that the grating is a planar grating which is present in a fibre succeeding the medium.

An alternative embodiment of the device according to the invention is characterized in that the grating is a planar grating arranged in the medium.

The advantage of the last-mentioned two embodiments is that the grating is not a separate component of the device, but forms part of a component already associated with the device.

The device in which the wavelength-selective feedback means comprise a partially reflecting element at the above-mentioned distance from the diode laser may comprise a separate reflecting element and a separate wavelength-selective element. However, the device is further preferably characterized in that the wavelength-selective feedback means are formed from one element which is both partially reflecting and wavelength-selective.

By combining the two functions of partial reflection and wavelength selection in one element, the number of components can be reduced, thus saving space.

This embodiment of the device according to the invention may be further characterized in that the element is an etalon.

An etalon is a very suitable element for realising a wavelength-selective reflection. An etalon is understood to mean an element comprising two partially reflecting flat or curved facing surfaces arranged at a given distance from each other. Some medium such as air may be present between these two faces. The etalon may alternatively be a light-conducting fibre or optical waveguide having a given length.

Alternatively, the last-mentioned embodiment may be characterized in that the element is a partially reflecting grating.

A further embodiment of the optical device according to the invention is characterized in that folding means for folding the radiation path are arranged between the diode laser and the feedback means.

The distance d between the diode laser and the feedback element required for the spectral stabilization of the laser beam can then be realised within a small volume so that the device may be compact.

The folding means may be constituted, for example by two facing reflecting surfaces between which the light beam propagates.

A preferred embodiment of the optical device according to the invention is characterized in that the folding means comprise a folding body of optically transparent material having at least two reflecting surfaces and being provided with an entrance window and an exit window, and in that one of the reflecting surfaces is provided with a third window for transmitting the diode laser radiation to and from the feedback means.

The means for folding the light path preferably comprise a body formed in one piece. In this way the tolerances are only determined when this body is manufactured, rather than by the mutual positioning of the two reflecting surfaces, as is the case with two separate, facing surfaces.

The folding body may be made of glass which may have a relatively high refractive index, for example n=1.8. The geometrical pathlength can then be reduced by a factor of 1.8 with respect to the geometrical pathlength in air with n=1 so that the device will become even more compact.

The entrance window and the exit window may both be provided in the first surface of the folding body and coincide with each other. In this case the diode laser radiation and the frequency-raised radiation are to be separated from each other between the location where the frequency raise is effected and the folding body. This may be effected by means of a wavelength-selective element, for example a beam splitter, so that also the frequency-raised radiation can be coupled out of the device.

Alternatively, the entrance window may be provided in the first reflecting surface and the exit window may be provided in the second reflecting surface. In that case the frequency-raised radiation need not be coupled out of the device by means of an extra element, but the exit window may be formed as a partially transmissive reflector.

The partially transmissive reflector is then preferably a wavelength-selective reflector which reflects the diode laser radiation and transmits the frequency-raised radiation.

The optical device according to the invention is preferably characterized in that the feedback means are integrated in the third window.

Due to this combination, the number of components can be reduced.

A possible embodiment of the optical device according to the invention is characterized in that each reflecting surface is provided with a layer having a high reflection coefficient.

Due to the presence of a layer having a high reflection coefficient, intensity loss in the folded light path is limited.

If the folding body is present behind the frequency-raising medium, this embodiment is preferably further characterized in that the high-reflection layer has a higher reflection coefficient for the radiation supplied by the diode laser and a lower reflection coefficient for the frequency-raised radiation.

A possible embodiment of the optical device according to the invention is characterized in that the folding body is a plane-parallel plate in which the first reflecting surface and the second reflecting surface are located opposite and parallel to each other.

An alternative embodiment of the optical device according to the invention, in which no high-reflection layers are necessary on the folding body, is characterized in that the folding body is present in a medium having a refractive index which is smaller than that of the body material, in that the folding body has at least two surfaces which totally and internally reflect radiation incident thereon and in that the radiation is reflected at least once by each one of said two surfaces when it traverses a coplanar radiation path in the folding body.

The optical device may be further characterized in that an optical prism is arranged on the entrance window and on the exit window, the surface of said prism, through which a radiation beam enters and leaves the prism, being transverse to the chief ray of the beam.

The optical prisms prevent false reflections from occurring when the radiation beam enters and leaves the folding body.

A further embodiment of the optical device according to the invention is characterized in that one of the reflecting surfaces is provided with a fourth window on which a retro-directive element is arranged by which the radiation, after having traversed a first radiation path extending to the reflecting surfaces via a number of reflections, is captured in a first plane within the folding body and is reflected parallel to itself, and re-enters the body so as to traverse at least a second radiation path extending to the reflecting surfaces via a number of reflections in a plane parallel to the first plane.

The retro-directive element ensures that an incident radiation beam, which is propagated through the body along a first radiation path in a first plane perpendicular to the first and second reflecting surfaces, is converted into a reflected radiation beam which is propagated through the body in a second radiation path in a second plane parallel to the first plane. In this way the third dimension of the body is also utilized for folding the radiation path. The retro-directive element may be, for example a prism having an apex angle of 90°, arranged on the folding body. The prism may alternatively be ground directly into the plane-parallel plate.

Such a geometry may be repeated several times so that more than two parallel faces can be utilized.

A further embodiment of the optical device according to the invention, in which the feedback means comprise a grating, is characterized in that the grating extends at a small angle different from 0° to the third window.

Since the wavelength-resolving power of a grating is also determined by the diameter of the beam which is incident thereon, this resolving power can be improved by causing the beam to be incident on the grating at a larger angle so that the diameter of the radiation spot on the grating is increased.

A further embodiment of the optical device according to the invention is characterized in that for the purpose of changing the wavelength of the radiation reflected towards the diode laser, the folding body is arranged rotatable over a small angle with respect to the radiation beam supplied by the diode laser.

A given wavelength can be selected by orienting the body and consequently the wavelength-selective element integrated therein in a different way with respect to an incident radiation beam.

A further embodiment of the device according to the invention is characterized in that the optical wavelength-selective feedback means are supplemented by an active control system comprising a detector which is sensitive to the frequency-raised radiation and a control unit controlled by the output signal of said detector for influencing at least one parameter determining the quantity of frequency-raised radiation.

The addition of an active control system to the optical feedback means provides the possibility of allowing larger temperature variations or of tuning the diode laser wavelength and the acceptance bandwidth of the non-linear optical medium to each other with an even greater precision:

Dependent on the choice of the wavelength-selective element, the preference shifts as regards the parameter to be influenced.

The embodiment using the additional active control system may be characterized in that the parameter is the electric current through the diode laser and in that the control unit controls this current.

Alternatively, this embodiment may be characterized in that the parameter is the diode laser temperature and in that the control unit controls this temperature.

In both cases the behaviour of the diode laser is influenced and the laser wavelength can be accurately corrected. By varying the laser current or laser temperature, the output spectrum will shift. Since a grating defines a wavelength absolutely, while an etalon periodically defines a wavelength in combination with the output spectrum of the diode laser, such a control has more effect in a device using an etalon than in a device using a grating. In a device using a grating this implies a fine control within the mode distance in the output spectrum of the diode laser, while in a device using an etalon it is possible to stabilize at another mode.

The embodiment using the additional active control system may be further characterized in that the parameter is the temperature of the non-linear optical medium and in that the control unit controls its temperature.

This embodiment of the device may be further characterized in that the parameter is the refractive index of the non-linear optical medium and in that the control unit controls the magnitude of an electric field across this medium.

Both controls provide the possibility of shifting the acceptance band of the non-linear optical medium and are suitable for a device using a grating as well as a device using an etalon. The advantage of an opto-electronic control over a temperature control is the great speed of adaptation.

A further embodiment of the device according to the invention is characterized in that the diode laser is a self-pulsing diode laser.

Any pulsing diode laser is suitable for such an application. Self-pulsing diode lasers are known per se, inter alia, from British Patent Application GB 2 221 094.

An embodiment of the device according to the invention is characterized in that the non-linear optical medium comprises a waveguide formed from a non-linear optical material.

A further embodiment of the device according to the invention is characterized in that the non-linear optical medium comprises a non-linear optical crystal.

The choice between these two possibilities is also determined by the requirements imposed on the device and its cost price. A crystal has the advantage that coupling in is simpler and mechanically more stable than in a waveguide, whereas a higher conversion efficiency of the diode laser radiation can be achieved with a waveguide.

A further embodiment of the device according to the invention is characterized in that the waveguide is formed from one of the materials KTP, $LiNbO_3$ or $LiTaO_3$.

KTP (potassium titanyl phosphate), $LiNbO_3$ (lithium niobate) and $LiTaO_3$ (lithium tantalate) are suitable materials for raising the frequency.

A further embodiment of the device according to the invention is characterized in that the non-linear optical crystal is $KNbO_3$ or $KLiNbO_3$.

$KNbO_3$ (potassium niobate) and $KLiNbO_3$ (potassium lithium niobate) in the form of a crystal are eminently suitable as a non-linear optical material for raising the frequency.

The invention also relates to an apparatus for optically scanning an information plane, which apparatus comprises a radiation source unit and an optical system for focusing the radiation supplied by the radiation source unit to a scanning spot in the information plane.

Such an apparatus, which is suitable for writing as well as for reading a record carrier and further comprises a radiation-sensitive detection system for convening radiation from the information plane into an electric signal is characterized in that the radiation source unit is constituted by an optical device as described hereinbefore.

An apparatus which is particularly suitable for writing a record carrier and further comprises an intensity switch for switching the intensity of the beam supplied by the radiation source unit in conformity with the information to be written is characterized in that the radiation source unit is a device as described hereinbefore and in that the intensity switch is constituted by means for setting one of the following parameters:

the repetition frequency of the diode laser pulses;

the optical path length of the radiation pulses returning to the diode laser;

the energy of the radiation pulses returning to the diode laser;

the acceptance band of the non-linear optical medium.

The invention will now be described in greater detail by way of example with reference to the accompanying drawing.

BRIEF DESCRIPTION OF THE DRAWING

FIGS. 21a, 21b and 21c show some embodiments of an optically transparent body in the form of a plane-parallel plate for folding the light path in an optical device according to the invention, FIGS. 22a and 22b show in a plan view and in a side elevation, respectively, a part of a second embodiment of an optically transparent folding body for folding the light path in three dimensions in an optical device according to the invention, FIG. 23 shows a third embodiment of an optically transparent body in the form of a bar for folding the light path in an optical device according to the invention. Corresponding components in the different Figures have identical reference numerals.

DESCRIPTION OF THE PREFERRED EMBODIMENT

Figure 1:
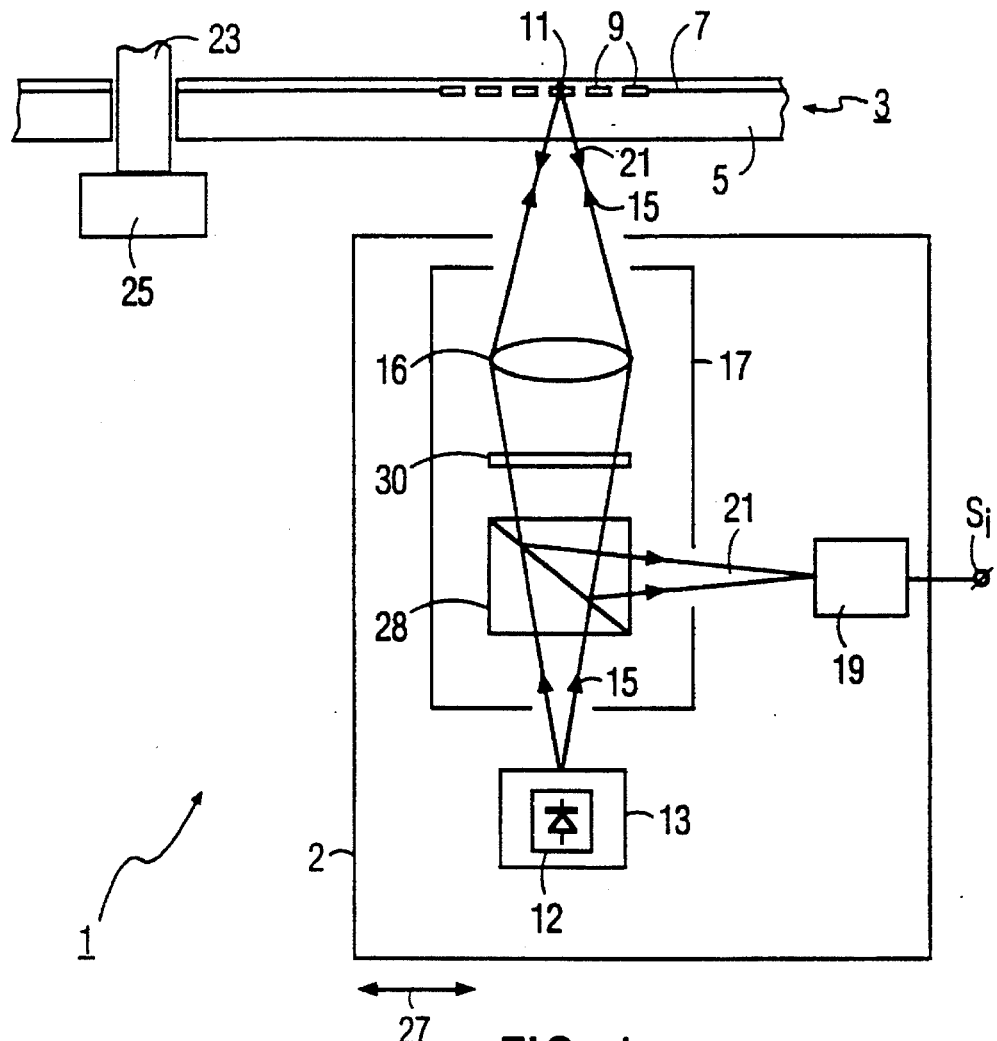
FIG. 1 shows diagrammatically an apparatus for optically scanning an information plane, comprising an optical device according to the invention.

FIG. 1 shows diagrammatically an apparatus I for optically scanning an information plane of an optical record carrier 3. Scanning is understood to mean scanning during writing as well as scanning during reading of a record carrier. The record carrier 3, which is partly shown in a radial cross-section, is formed from a transparent substrate 5 and a reflecting information layer 7. This layer 7 comprises a large number of information areas (not shown) which are optically distinguished from their surroundings. The information areas are arranged in a large number of tracks 9, for example quasi-concentric tracks which jointly constitute a spiral track. These tracks 9 are scanned by means of a scanning spot 11. To this end the apparatus comprises an optical device 2 with a radiation source unit 13 which supplies a radiation beam 15, an optical system 17 for focusing this radiation beam 15 to a scanning spot 11 on the record carrier 3 and a detection system 19 for convening the reflected radiation 21 from the record carrier 3 into an electric signal. The beam 15 generated by a radiation source 12 and emitted by the radiation source unit 13 is focused by an objective system 16 shown diagrammatically by means of a single lens element to a read spot 11 in the information plane which reflects the beam 15. When the record carrier 3 is rotated by means of a shaft 23 which is driven by a motor 25, an information track is scanned. By moving the record carrier 3 and the device 2 with respect to each other in the direction denoted by the arrow 27, the entire information plane can be scanned.

During scanning the reflected beam 21 is modulated in intensity in accordance with the information stored in the succession of information areas. In order to separate the reflected beam 21 from the projected beam 15, the optical system 17 may be provided, for example with a partially transparent mirror (not shown) which reflects a part of the reflected and modulated beam 21 towards the radiation-sensitive detection system 19. However, the combination of a polarization-sensitive beam splitter 28 and a λ/4 plate 30 as shown in FIG. 1 is preferably used. It is then ensured that the laser beam 15 has such a direction of polarization that this beam is completely passed by the beam splitter 28. On its path to the record carrier 3, this beam traverses the λ/4 plate 30 a first time and after reflection by the record carrier it traverses this λ/4 plate a second time so that its direction of polarization is rotated through 90° before it enters the beam splitter 28 again. Consequently, the beam 21 is completely reflected towards the detection system 19.

For further details of the read apparatus reference is made to the article "Het systeem "Compact Disc Digital Audio" by M. G. Carasso, J. B. H. Peek and J. P. Sinjou in Philips Technisch Tijdschrift 40, 267–272, 1981/82, no. 9.

For the sake of compactness of such apparatuses a diode laser is chosen as radiation source 12. Furthermore, such apparatuses require a small scanning spot because this may increase the information density in optical record carriers to a considerable extent. By doubling the frequency of the radiation of a conventional diode laser or, in other words, by halving the wavelength, a desired reduction of the scanning spot can be realised. Frequency doubling can be realised by passing the diode laser radiation through a non-linear optical medium. One of the characteristic parameters of a non-linear optical medium is the acceptance bandwidth. This is the wavelength band within which the medium ensures frequency doubling of the supplied radiation. The location of the acceptance band is, however, greatly temperature-dependent. At a given temperature the crystal determines which wavelengths contribute to the frequency-doubled radiation.

On the other hand, diode lasers have the drawback that the wavelength is also greatly temperature-dependent. Moreover, diode lasers are very sensitive to laser light which returns in the active layer of the laser due to reflections in the optical system. Consequently, the output spectrum of the laser as well as the intensity of the laser beam may be influenced considerably.

In order to generate sufficient frequency-doubled radiation, the laser wavelength and the location of the acceptance band of the medium should be and remain attuned to each other. This could be achieved by stabilizing the diode laser as well as the non-linear optical medium very accurately in temperature, which is a relatively difficult and expensive solution. According to the invention the envisaged object can be realised in a considerably simpler manner by making use of a pulsed diode laser in combination with feedback means. It can then be ensured that the diode laser radiation is set to a wavelength which is within the acceptance bandwidth of the non-linear optical medium.

Figure 2:
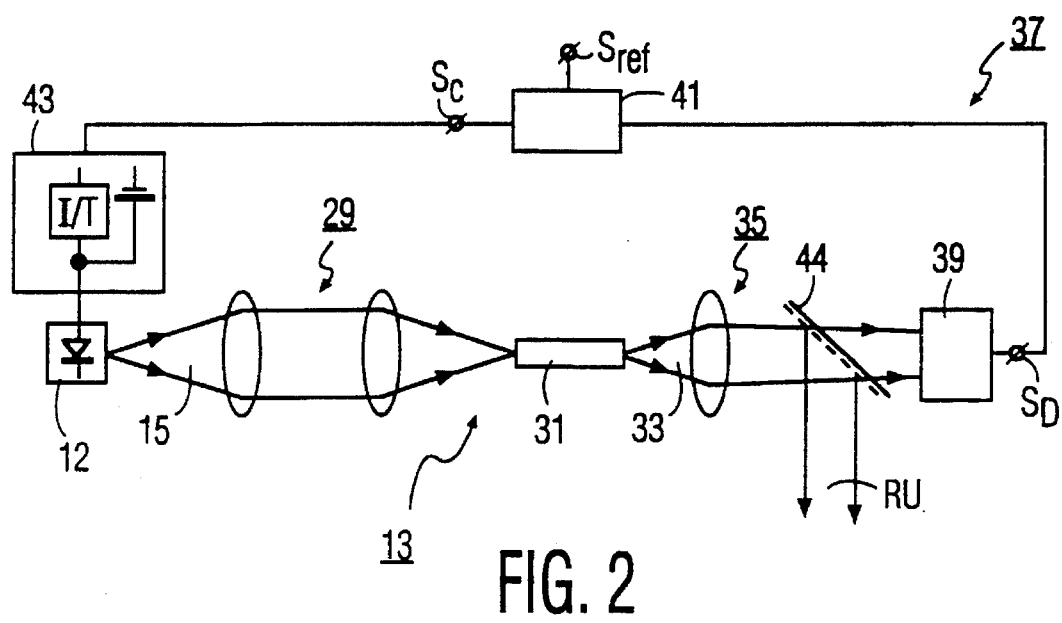
FIG. 2 shows a first embodiment of an optical device according to the invention, in which opto-electronic feedback takes place.
Figure 3:
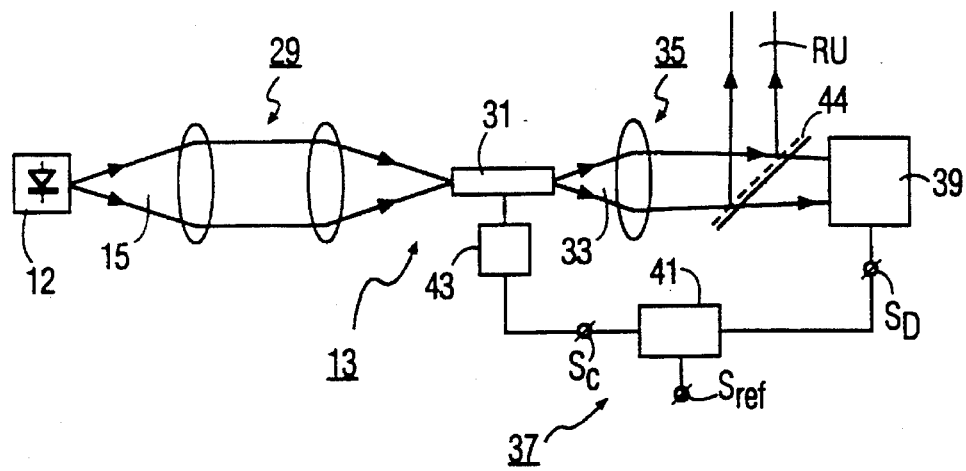
FIG. 3 shows a second embodiment of an optical device according to the invention, in which opto-electronic feedback takes place.

The desired feedback can be realised in different ways. A first possibility is the opto-electronic way, as is shown in FIGS. 2 and 3. In this case use is made of the fact that the spectrum of a pulsed diode laser consists of different modi and that there are thus different wavelengths, at least one of which is invariably within the acceptance bandwidth or two of which have an average wavelength which is within the acceptance band. Consequently, a detectable quantity of frequency-doubled radiation will be present, even at relatively large temperature variations, with which radiation the diode laser wavelength can be optimally set via feedback.

In the radiation source unit 13 shown in FIG. 2 the radiation beam 15 generated by the diode laser 12 is focused by means of a first lens system 29 comprising, for example two lens elements, on a non-linear optical medium 31 in which this radiation is doubled in frequency. The radiation 33 emerging from the medium 31 is concentrated by a second lens system 35, for example comprising a single lens element, on a detector 39 which is sensitive to the radiation raised in frequency. This detector forms part of an active control system 37 which further comprises a comparator 41 and a control unit 43. A part of the frequency-doubled radiation is converted by the detector 39 into an electric signal $S_D$. This signal is compared in the comparator with a reference signal which is representative of the desired quantity of frequency-doubled radiation. The difference between the signals $S_D$ and $S_{ref}$ is converted into a control signal $S_C$ with which the control unit 43 is controlled. With reference to the detector output signal $S_D$, which is a measure of the intensity of the frequency-doubled radiation, the wavelength of the radiation supplied by the diode laser 12 can thus be set by varying one of the adjustable parameters of the diode laser. Dependent on the parameter with which the quantity of frequency-raised radiation can be influenced, the control unit 43 has a different implementation. The adjustable parameters are, for example the laser current and the laser temperature. This means that the control unit 43 may be adapted to set the electric current or the diode laser temperature. The choice between the two alternatives is represented by I/T in the Figure. Since the laser wavelength varies with the temperature, the wavelength supplying a maximum power of frequency-doubled radiation can be accurately set by varying the temperature of the diode laser.

FIG. 3 shows a further embodiment of the opto-electronic feedback in which the control unit 43 influences the non-linear optical material. This control may be, for example a temperature control. By varying the temperature of the non-linear optical material, the acceptance band of the non-linear optical material can be shifted in such a way that an optimum overlap with the wavelength band of the diode laser is produced.

A further opto-electronic feedback is to provide the non-linear optical material with electrodes. By applying a voltage between the electrodes and hence an electric field across the non-linear optical medium in accordance with the detector signal $S_D$, the refractive index of this medium can be changed so that its acceptance band can be shifted.

The opto-electronic feedback may also be realised dynamically. To this end, the intensity of the frequency-raised radiation is modulated with a small amplitude and a phase-synchronous detection of this radiation is used, i.e. the phase of the modulated signal $S_D$ is compared with the phase of the control signal with which the modulation is established. In this way a small variation in intensity of the frequency-raised radiation can already be detected and corrected. The intensity of the frequency-raised radiation may be modulated, inter alia, by varying, for example the DC component of the electric current through the diode laser or by electro-optically varying the acceptance band of the non-linear medium.

For controlling the maximum quantity of frequency-raised radiation by means of the opto-electronic feedback 37, only a small part of this radiation is to be used so that the rest is available as useful radiation for use in an optical apparatus such as the scanning apparatus shown in FIG. 1. The useful radiation RU may be split from the devices according to FIGS. 2 and 3 by means of, for example a partially transparent element such as a partially transparent mirror 44 which is arranged at an arbitrary position between the non-linear optical element 31 and the detector 39.

Instead of the lens systems 29 and 35 for imaging the exit face of the diode laser on the non-linear optical element and for concentrating the radiation emitted by this element, optical fibres or planar waveguides may alternatively be used.

A considerable increase of intensity of the frequency-raised radiation may be obtained by realising an optical feedback which is wavelength-selective instead of an opto-electronic feedback.

Figure 4:
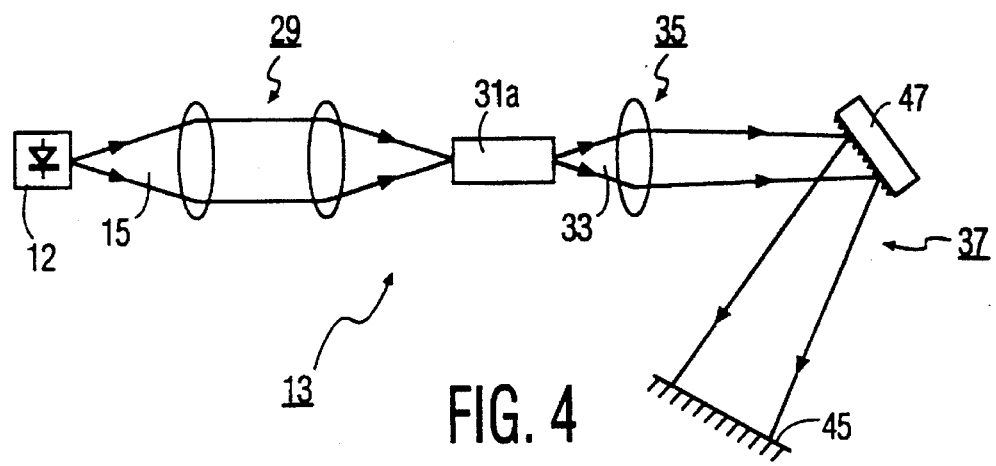
FIG. 4 shows a first embodiment of an optical device according to the invention, in which optical feedback takes place.

FIG. 4 shows an embodiment of a device in which this is realised. This device utilizes the aspect that the pulsed diode laser behaves as a monomode laser due to selective feedback of that wavelength which is within the acceptance bandwidth of the non-linear optical medium 31. Since it has been ensured that this wavelength is within said acceptance bandwidth, the quantity of frequency-raised radiation is considerably raised, for example a factor of fifteen under certain circumstances, with respect to this quantity in the devices shown in FIGS. 2 and 3.

Figure 6:
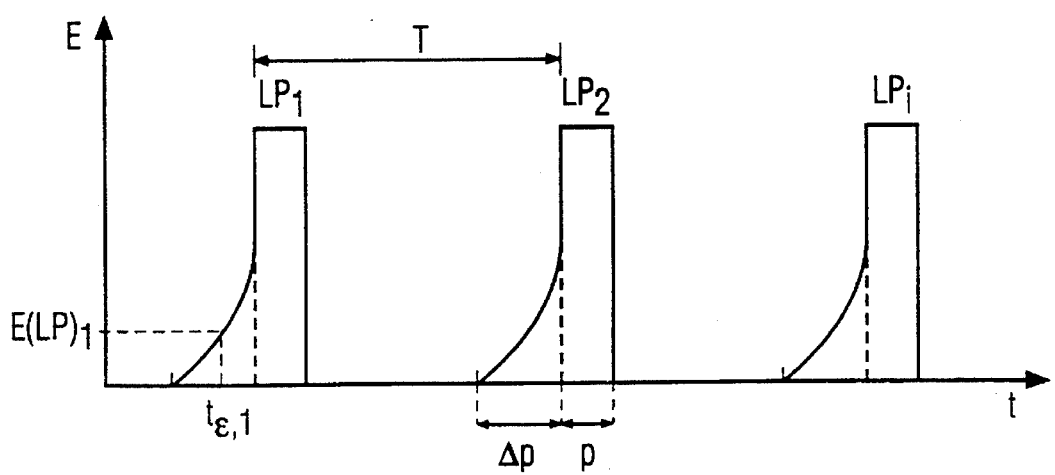
FIG. 6 shows a pulse series emitted by the diode laser.
Figure 5A:
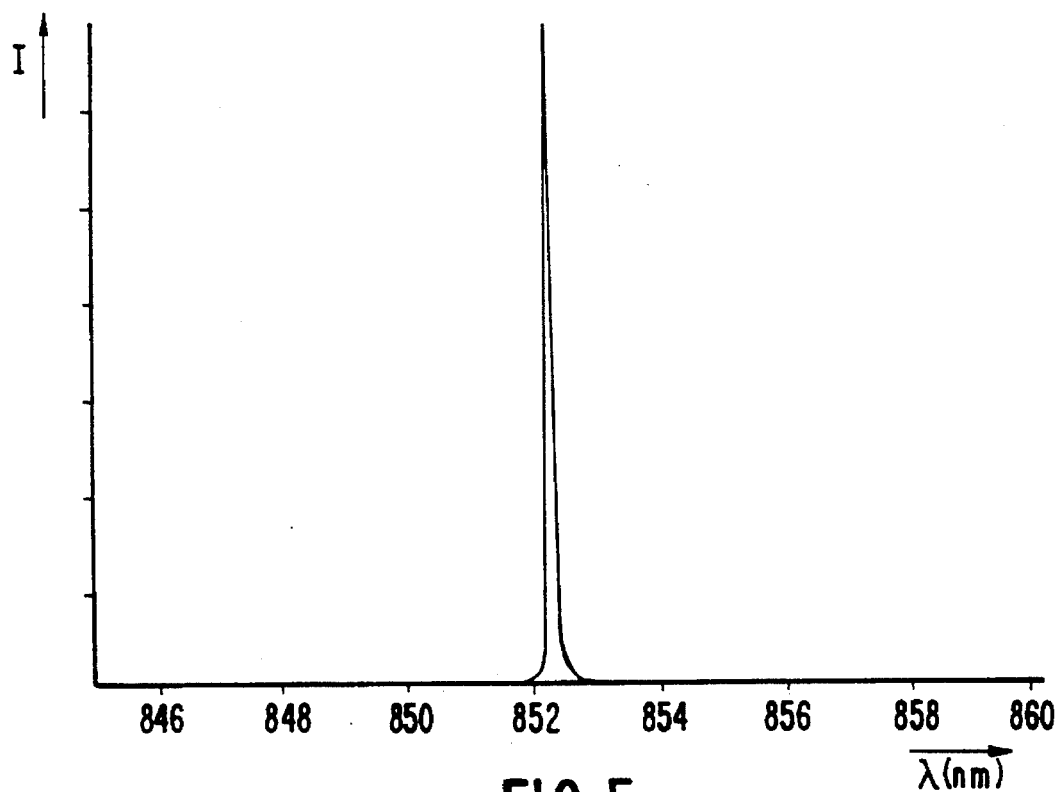
FIG. 5a shows a diode laser spectrum of a device in which wavelength-selective feedback is used.
Figure 5B:
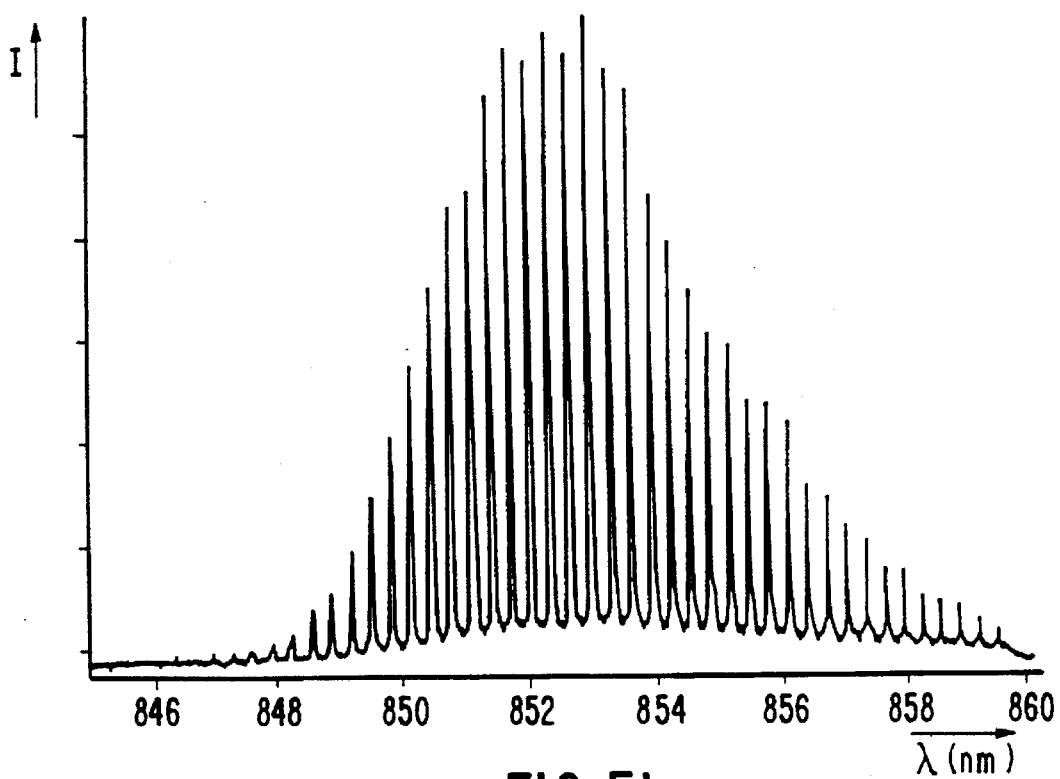
FIG. 5b shows the same diode laser spectrum without feedback.

The effect of selective feedback is illustrated in FIGS. 5a and, 5b. FIG. 5a shows the diode laser spectrum with feedback, while FIG. 5b shows the spectrum emitted by the diode laser when there is no wavelength-selective feedback. In these Figures the wavelength $\lambda$ is plotted on the horizontal axis and the intensity is plotted on the vertical axis. In order that the optical feedback has the desired maximum effect and that the influence of unwanted feedbacks due to reflections of diode laser radiation on optical elements in the apparatus in which the frequency-raised radiation is to be used is minimized, it should be ensured that the radiation pulse reflected by the selective feedback means 37 in FIG. 4 has such an energy and arrives at the diode laser at such an instant that it can maximally influence the diode laser radiation. This intensity condition and delay time condition which a reflected laser pulse portion $LP_r$ must satisfy, can be derived with reference to FIG. 6. In this Figure a number of pulses $LP_i$ of the laser pulse series is shown, with i=1, 2, . . . , N. It has been assumed that the pulse duration of the laser pulse is p and the period of the series is T. In order that a reflected pulse $LP_r$ could influence a pulse $LP_i$ emitted by the diode laser, the delay time $R_t$ of the reflected pulse should be within a given range. Moreover, the effect thereby produced is greatly dependent on the radiation energy of the reflected pulse with respect to the radiation energy of the pulse building up. The delay time range limits are given by:

$$R_t = T$$

$$R_t = T - p - \Delta p$$

Since, in principle, it is also possible that a reflected laser pulse $LP_{r,1}$ does not drive the next laser pulse $LP_2$ but the second next pulse $LP_3$ or one of the subsequent pulses $LP_i$, the above-mentioned limits can be generalized to:

$$R_t = nT \text{ with } n = 1, 2, \ldots ,$$

$$R_t = nT - p - \Delta p \text{ with } n = 1, 2, \ldots$$

The radiation energy condition may be formulated as follows:

$$E(P_r) > E(LP_i)$$

at an instant $t_{e,i}$ within the build-up time of the i-th pulse, at which instant the reflected radiation pulse enters the laser.

This means that the radiation energy of the reflected pulse must be larger than the radiation energy built up at that instant in the laser for the next pulse to be emitted by the diode laser, in order that the reflected pulse could influence the diode laser behaviour at the instant $t_{e,i}$.

If the upper limit $R_t = n.T$ were satisfied, the trailing edge of the reflected radiation pulse would coincide with the instant when the next pulse to be emitted is completely built up so that the reflected pulse no longer has any influence on the pulse to be emitted. If the lower limit $R_t = nT - p - \Delta p$ were satisfied, the leading edge of the reflected pulse would coincide with the instant when the build-up of a new pulse has not yet started so that it cannot be influenced.

Said limits are not absolute limits. Under circumstances some effect may still occur when these limits are slightly exceeded.

On the other hand, the delay time, i.e. the time required by a radiation pulse $LP_i$ to cover the path from the exit face of the diode laser and back to the diode laser, is given by 2d/c in which d is the distance between the diode laser 12 and the feedback element 27 and c is the speed of propagation of the light in the medium traversed by the radiation beam. In combination with the two limiting conditions, this yields the following delay condition:

$$nT - p - \Delta p < \frac{2d}{c} < nt$$

so that the distance d is thus given by:

$$d = \frac{c}{2} \cdot nT - \frac{c}{2} \cdot \epsilon(p + \Delta p)$$

in which ε is a number larger than zero and smaller than one whose value is determined by the energy of the reflected pulse. If this energy is relatively large, the reflected pulse may arrive at a later instant within the build-up time so that ε is then closer to zero than to one. If the energy of the reflected pulse is lower, this pulse should arrive at an earlier instant within the build-up time so that ε is then closer to one than to zero. ε is therefore inversely proportional to the reflected pulse energy.

The optical feedback can be realised by arranging an at least partially reflecting element 45 having a suitable reflection coefficient at a distance d from the diode laser 12. By ensuring that all other elements which may reflect radiation are arranged at a distance which does not satisfy the above-mentioned general condition for d, it is achieved that the behaviour of the diode laser, and hence the parameters and quality of the laser beam are substantially only determined and maintained constant by the feedback via the first-mentioned element 45.

However, the location of the wavelength-selective element 47 is not essential as long as the above-mentioned delay time condition is satisfied by the reflecting element 45.

In practice the feedback means 37 may be implemented in different ways.

A first possibility is shown in FIG. 4 in which the wavelength-selective element 47 is a grating. This grating reflects the incident laser radiation towards the reflecting element 45, for example a mirror. The radiation reflected by the mirror is reflected by the grating towards the diode laser 12. The direction at which the grating reflects radiation is determined by the wavelength of the radiation and the period of the grating, i.e. the distance between two equal grating strips. This period may be chosen in such a way that only the radiation having the wavelength within the acceptance bandwidth of the non-linear optical medium enters the diode laser.

In a realised embodiment of the device in which the diode laser emits radiation at a wavelength of approximately 850 nm (red light), and in which the non-linear optical medium is a KTP (potassium titanyl phosphate) waveguide in which the frequency of the diode laser light is doubled, the grating has a period of 1.67 μm, i.e. 600 strips per mm. The average laser power is of the order of 20 mW at a ratio of 1:3.5 of the emitted pulse width and the pulse repetition frequency and the power of the frequency-doubled light (blue light) is approximately 150 μW. A temperature stabilization need not be performed.

Since the different laser modes are close together, for example at 0.3 nm, as can be derived from FIG. 5a, the grating must have a large dispersive power so that the radiation portions of different wavelengths are spatially well-separated. The dispersive power is dependent on the number of grating periods covered by the incident radiation beam. If radiation diffracted in a second or higher order is used for the feedback, the grating with the desired dispersive power may have a larger grating period so that it can be manufactured in a simpler manner.

The grating may be manufactured in known manner by a mechanical process (scratching) or via a lithographic process. Such a grating may also be obtained by causing two plane radiation waves to interfere on a photographic plate and by developing and etching this plate. A holographic grating is then obtained. By adapting the wavefronts, certain optical properties such as a given extent of convergence or divergence or corrections can be given to the holographic grating.

A large number of inexpensive copies can be obtained by using a support on which a grating structure is provided in one of the manners described above as a matrix in a replica process.

Figure 7:
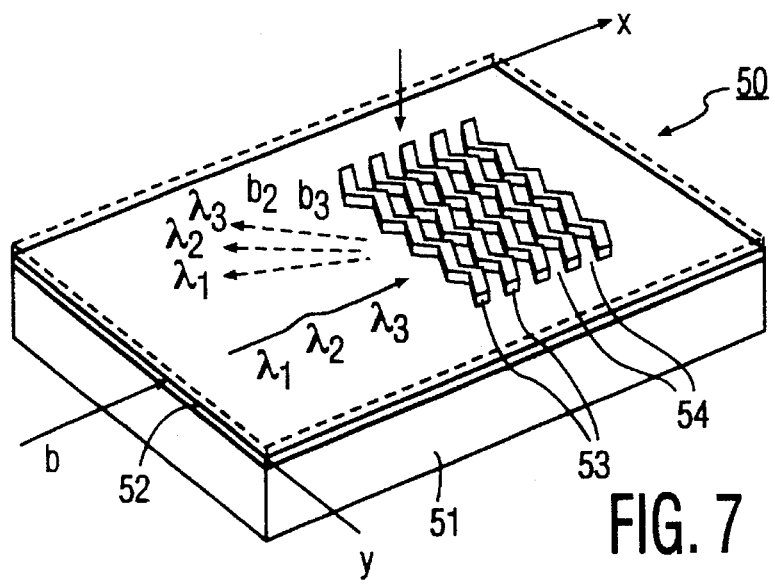
FIG. 7 shows an embodiment of a planar grating suitable for use in an optical device according to the invention.

The grating may also be a planar grating 50 which is shown in FIG. 7. In this Figure a light-conducting layer 52 is provided on a substrate 51 of, for example glass, a transparent synthetic material, a semiconductor material or a crystal such as lithium niobate. The layer 52 consists of a transparent material whose refractive index is higher than that of the substrate so that the greater part of the energy of the beam entering at the left-hand side remains enclosed within the layer. The layer 52 is provided with a two-dimensional periodical structure of meandering elongate areas 53 which alternate in the X direction with elongate intermediate areas 54. The areas 53 may be located at a higher or lower level than the intermediate areas 54 of the layer 52. It is also possible that the areas 53 and 54 are located at the same height but have a different refractive index. The structure 53, 54 reflects the radiation coupled into the layer 52 in a certain direction, dependent on the wavelength of this radiation, which is shown in FIG. 7 by means of $b_1$, $b_2$ and $b_3$. For further particulars about the construction and operation of the planar grating 50, reference is made to U.S. Pat. No. 4,746,136 in which the use of such a grating in a multiplexer for optical waveguide communication systems is described.

Figure 8:
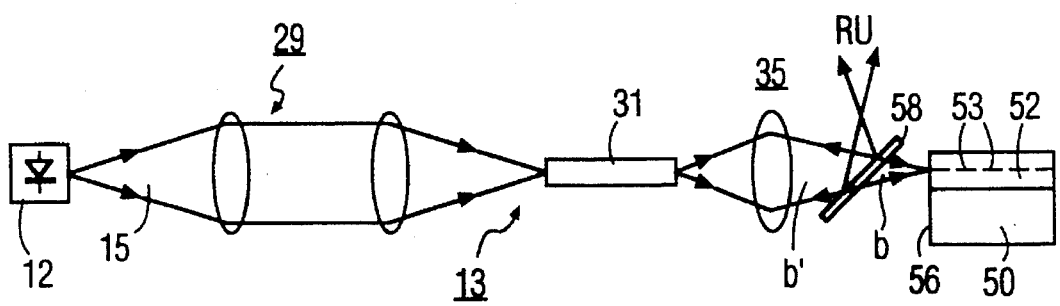
FIGS. 8 to 15 show a number of different embodiments of an optical device according to the invention, in which optical feedback takes place.

The planar grating may be used as an alternative to the grating 47 in the device shown in FIG. 4. However, the device may be simplified if use is made of the reflection properties of the grating 50 as is shown in FIG. 8. The lens system 35' must now ensure that the radiation from the non-linear element is focused in the light-conducting layer 52. The planar grating element 50 can be positioned in such a way that the normal on the front face 56 extends at a small angle to the chief ray of the entering beam so that the direction of the reflected beam component b' with the desired wavelength is exactly opposite to the direction of the diode laser beam b.

Figure 9:
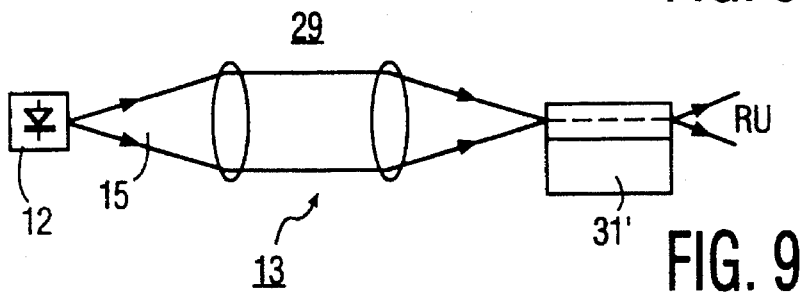

An even simpler embodiment of the device is the embodiment in which the grating is integrated in the non-linear optical medium 31', as is shown in FIG. 9. After the foregoing description, this Figure does not require any further explanation.

Figure 10:
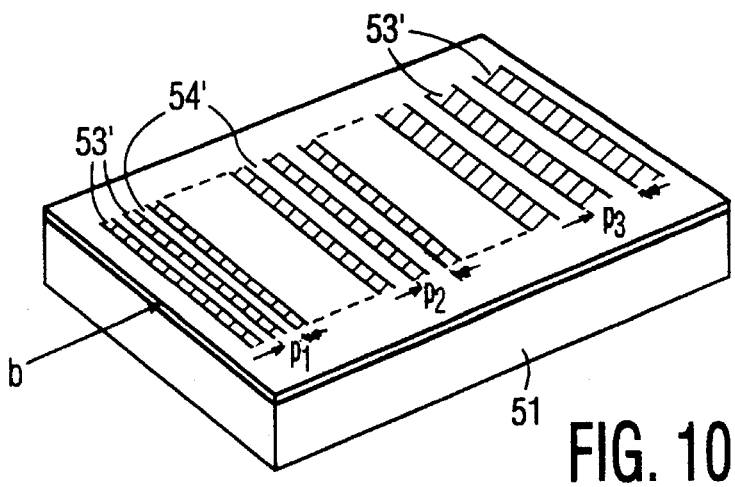

In the device according to the invention a grating having straight elongate areas but a monotonically varying period may also be used, as is shown in FIG. 10. In this Figure only three grating portions with periods $P_1$, $P_2$ and $P_3$ have been shown for the sake of clarity and the difference between the periods is exaggerated. Actually, the grating comprises more grating portions and has more different periods and the differences between the periods are smaller. Each one of the grating portions located one behind the other in the direction of propagation of the radiation beam b will reflect radiation at a wavelength which is specific of the relevant portion in the diode laser. By adjusting a specific value of the laser pulse repetition frequency it can be ensured that the delay time condition is satisfied by a radiation pulse originating from that grating portion which reflects radiation in the diode laser and whose wavelength is within the acceptance bandwidth of the non-linear optical element.

Figure 11:
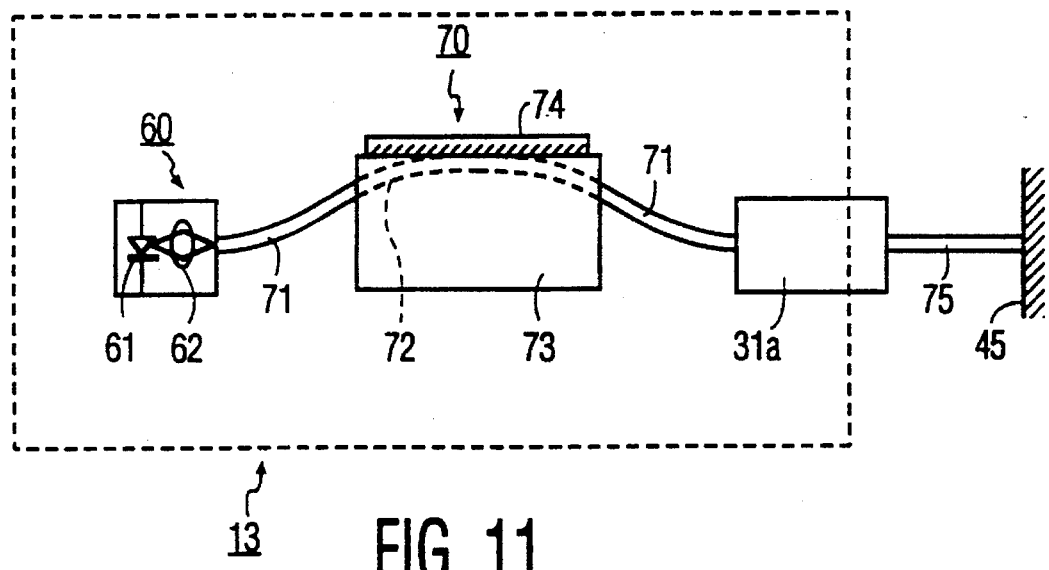

In a device in which one or more lens systems are replaced by one or more optical fibres, the grating may be arranged in such a fibre. An embodiment in which this is the case is shown in FIG. 11. In this Figure the reference numeral 60 denotes a special envelope developed for fibre communication systems, incorporating a diode laser 12 and a lens system 62 for imaging the diode laser output on the entrance face of a fibre 71. The wavelength-selective fibre element 70 may be implemented as described in British Patent Application GB 2,161,648. In this element a part of the fibre 71 is provided in a curved duct of a block 73 of, for example glass. The upper portion of this fibre piece has been ground away as far as the core 72 on which a grating 74 is provided. The remaining space between the grating and the fibre piece is filled with a liquid having a suitable refractive index. A part of the radiation propagating through the fibre core is scattered towards the liquid and reaches the grating which deflects the radiation whereafter it enters the fibre core. The period of the grating determines the wavelength of the radiation which, after interaction with the grating, constructively interferes with the directly passed light. For further details about the element 70 reference is made to German Patent Application DE-3254754 describing such an element for stabilizing a diode laser via wavelength-selective feedback.

An optical fibre with an integrated grating may alternatively be obtained by etching a periodical structure in the cladding of the fibre.

In the embodiment of FIG. 11 the wavelength-selective element is arranged between the diode laser and the non-linear optical medium 31. The element 50 of the device shown in FIG. 8 may alternatively be arranged at such a position.

Figure 12:
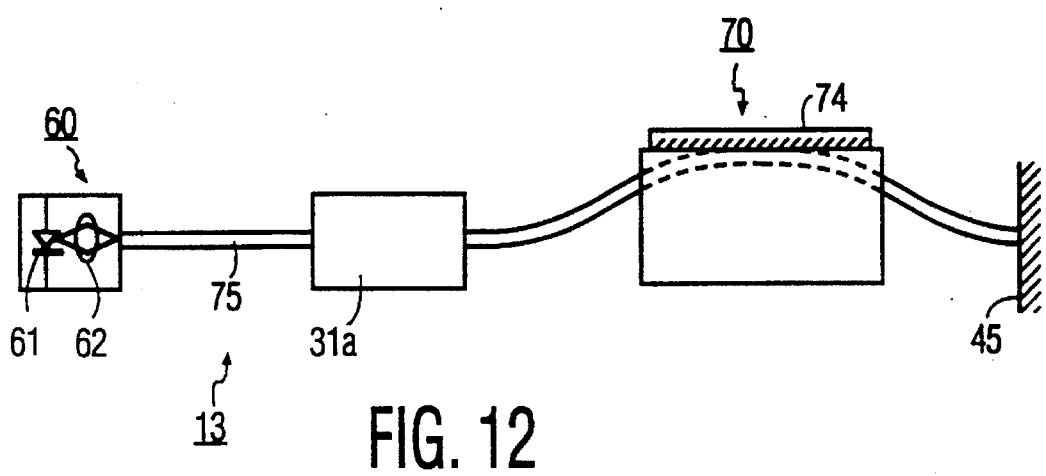

FIG. 12 shows an embodiment in which a wavelength-selective fibre component 70 is arranged behind the non-linear optical element 31 and in which an optical fibre 75 is arranged between the last-mentioned element and the laser.

The grating 74 in the component 70 is preferably a reflecting grating which reflects a part of the radiation propagating through the fibre 71 towards the diode laser. If this grating is arranged at such a position that the above-derived delay time condition applies to the radiation pulse reflected by this grating, the reflector 45 may be dispensed with.

Figure 13:
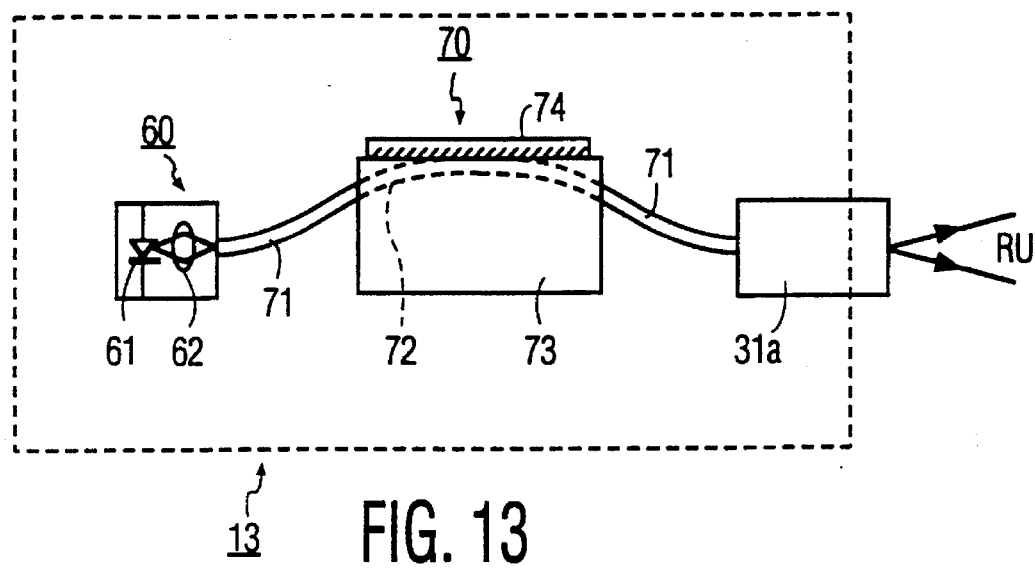

Another embodiment of the radiation source unit 13 provided with a component 70 with a reflecting grating is illustrated in FIG. 13. The embodiment shown in this Figure does not comprise a reflector 45 and a fibre 75. This embodiment has the advantage that no frequency-raised radiation traverses the fibre 71 so that this fibre can be optimized for the diode laser radiation. The frequency-raised radiation can then be directly taken from the non-linear optical medium 31.

This also holds for the device shown in FIG. 9. In the devices shown in FIGS. 11 and 12 the frequency-raised radiation can be coupled out of the device by implementing the reflector 45 as a dichroic mirror which passes this radiation but reflects the laser radiation. In the device according to FIG. 8 the frequency-raised radiation can be coupled out by arranging a dichroic mirror 58, which reflects this radiation and passes the laser radiation, between the non-linear optical medium 31 and the planar grating 50. In the device according to FIG. 4 the reflector 45 may be implemented as a dichroic mirror which passes the frequency-raised radiation. If the reflecting grating 47 is arranged at the position of the reflector 45 so that this reflector can be omitted, a dichroic mirror for coupling out the frequency-raised radiation should be arranged between this grating and the non-linear optical element.

Figure 14:
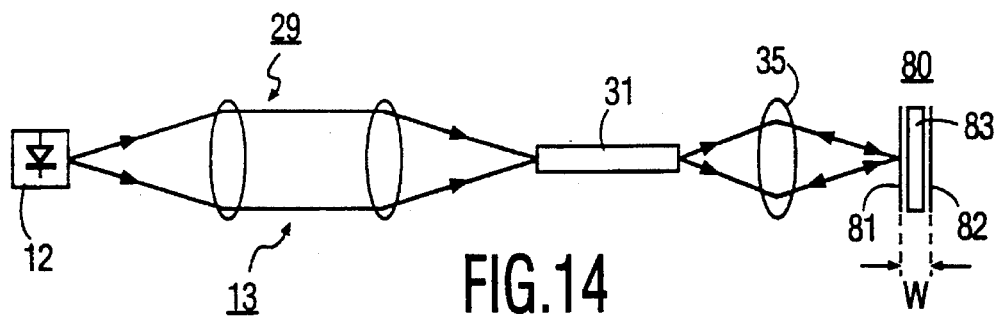

The required functions of wavelength selection and reflection towards the diode laser may not only be fulfilled by a reflecting grating but also by a Fabry-Pérot etalon as is shown in FIG. 14. Such an etalon comprises two partially reflecting, flat or curved surfaces enclosing a medium such as, for example air or glass. Since multiple reflections occur on the surfaces, there will be constructive and destructive interferences between beam portions. By suitable choice of the distance w between the surfaces and/or the refractive index of the medium, it can be ensured that radiation having a given wavelength is reflected. This wavelength is of course again within the acceptance bandwidth of the non-linear optical medium 31.

Figure 15:
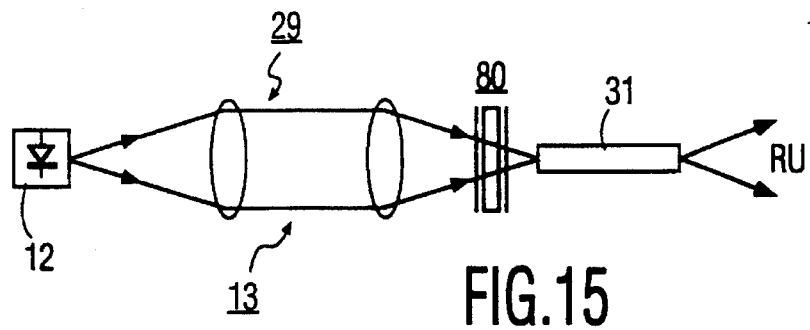

The etalon may be used in reflection, as is shown in FIG. 14, but also in transmission, as is shown in FIG. 15 which does not require any further explanation. A transmission etalon may also be used in the device shown in FIG. 14. In that case a reflector should be arranged at the distance d behind this etalon. This reflector may be a dichroic mirror which completely passes the frequency-doubled radiation.

The etalon may alternatively consist of an optical fibre of a given length. In order that the reflected radiation pulse returning in the diode laser can determine at which wavelength this laser is emitting, the energy of this radiation pulse will have to be larger than the radiation energy built up at the instant of return in the diode laser, as has been noted hereinbefore. The energy of the reflected radiation pulse may be influenced by the reflection coefficient of the reflecting element 45 or the element (50, 31', 80) combining the functions of wavelength selection and reflection.

Notably for high-power diode lasers with which, for example optical record carriers can be written and whose exit face has a low reflection coefficient, the reflection coefficient of the feedback element, for example, element 80 in FIGS. 14 and 15 plays an important role. In fact, it has been found that the diode laser with a low reflection coefficient of the exit face emits at a shorter wavelength than such a diode laser with a high reflection coefficient of the exit face, presumably as a result of the larger charge carrier density in the first-mentioned laser during the laser action. As it were, the reflection coefficient of the exit face of the diode laser and hence the wavelength can be set due to the choice of the reflection coefficient of the feedback element 80. When a grating is used as a feedback element, this effect does not play a role because this grating fixes the diode laser wavelength. However, if an etalon is used as a feedback element, the diode laser wavelength can be fixed by the reflection coefficient of this element.

In practice the distance d between the diode laser and the feedback element, which distance is required to obtain spectral stabilization of the diode laser, may be relatively long, which is a drawback due to the desired compactness of the optical device. For example, for a pulse period p of 1 ns, a distance d of approximately 150 mm is required.

In accordance with a further aspect of the present invention the light path between the diode laser 12 and the feedback element 27 is folded. To this end the device may comprise, for example two facing reflectors between which the radiation beam is reflected a number of times. However, due to the stability, one body 120 of optically transparent material, for example a glass body is preferably used, in which two facing surfaces are reflecting so that a radiation beam entering the body is reflected many times. The tolerances are then determined during manufacture of the body. The folding body may not only be made of glass but also of other optically transparent materials having a sufficiently high refractive index, such as transparent synthetic material.

There may be different embodiments of such a folding body 120. A first embodiment is shown in FIG. 21*a* and comprises a plane-parallel plate 121, of which a first surface 123 and a second surface 125, which surfaces are located opposite each other, are provided with a reflection layer 127 having a high reflection. The first surface 123 further has an entrance window 129 and the second surface 125 has an exit window 131. A radiation beam 15 emitted by the diode laser 12 enters the plane-parallel plate 121 through the entrance window 129, for example via a collimator lens 132 and, since the beam is incident on the surfaces 123 and 125 at a small angle, it is reflected many times by these surfaces. The beam then reaches a wavelength-selective reflecting element 27 which is arranged in or behind a third window 128 in one of the surfaces. Subsequently, the beam traverses the plate 121 in the reverse direction so as to leave it via the window 129 on its way to the diode laser.

The exit window 131 is used for coupling the frequency-raised radiation out of the optical device and to this end it is formed as a beam separating mirror. The window 131 is preferably provided with a layer 134 which has a high reflection for the fundamental wavelength and a low reflection for the generated higher harmonic wave, as may also be the case for the layer 127 on the first surface 123 and the second surface 125. In that case the layers 127 and 134 on the second surface 125 may constitute one uninterrupted layer.

The wavelength-selective feedback element 27 may be a separate component. However, this element is preferably integrated with the plane-parallel plate 121, i.e. it is arranged at the location of the window 128. This element may be, for example a prism. The prism may be arranged on the window or formed by a recess in the window. A grating 27 as shown in FIG. 21*a* is, however, preferred because of its relatively high wavelength-resolving power.

A grating may be integrated in the glass body in different manners. For example, the grating may be directly etched in a glass folding body or arranged as a separate component on the folding body. Another possibility is to provide a thin synthetic material layer on the folding body in which subsequently the grating is provided by means of a replica technique.

Due to folding, a radiation path having a length of, for example 130 mm in air for a radiation beam with a diameter of 3 mm can be accommodated in a glass plate having a thickness D of 8 mm and a length L of 13 mm, if the glass has a refractive index of 1.8.

Folding may alternatively be effected three-dimensionally instead of two-dimensionally. To this end a retro-directive element 133 may be arranged on a fourth window 136 at the end of a first light path 135 on the glass body as shown in FIG. 22. After the radiation beam has traversed the first light path 135, which is located in a first plane perpendicular to the reflecting surfaces of the glass body, it is first reflected in the direction perpendicular to the plane of the drawing and subsequently reflected in a direction parallel to the direction of incidence on the element 133 so that the beam is passed into the plane-parallel plate 121 again so as to traverse a second light path 137 located in a second plane parallel to the first plane. In this way the folded light paths 135, 137 and possibly further light paths are stacked and consequently a folding body having a shorter length L can be used for realising a light path having a total length d which is required for spectral stabilization. This embodiment is shown in FIG. 22. FIG. 22*a* is a plan view and FIG. 22*b* is a side elevation.

A very suitable example of a retro-directive element 133 is a prism having an apex angle of 90°. The top rib of this prism is perpendicular to the chief ray of the beam. The prism has been ground in such a way that the base face 139 located opposite the top rib is parallel to the surface 125 so that there are no reflection losses.

In another possible embodiment the folding body 120 according to the invention has a rectangular or square cross-section as is shown in FIG. 23. In this embodiment the surfaces 145, 146, 148, 149 are oriented with respect to the incident radiation beam in such a way that there is total internal reflection of the beam on each surface. In the embodiment of FIG. 23 this is effected twice for each surface before the beam reaches the feedback element 27 which is arranged in or behind the window 153. After reflection by this element, the beam traverses the same radiation path in the reverse direction and leaves the folding body via the surface 145 on its way to the diode laser.

The frequency-raised radiation leaves the optical device via the surface 149. At the position where this is realised a wavelength-selective reflection layer 151 is provided, which layer has a high reflection for radiation from the diode laser and is transparent to the frequency-raised radiation. Moreover, a prism 147 is preferably provided at said position and its surface 150 is perpendicular to the chief ray of the beam. A similar prism 143 with a perpendicular surface 152 is also preferably arranged on the surface 145 at the location where the diode laser beam enters the folding body. Both prisms may be made of, for example the same material as the glass body. Similarly as in the embodiment including the plane-parallel plate, the feedback element 27 may be a prism or an etalon which is arranged in or behind the window 153 in the glass body.

In the same way as is shown in FIGS. 22*a* and 22*b* for the plane-parallel plate, the folding body of FIG. 23 may comprise a plurality of folded light paths in parallel planes within the glass body which are stacked by means of a retro-directive element so as to realise folding in three dimensions.

Both embodiments 121,122 of the folding body may alternatively be implemented in such a way that the entrance window and the exit window are located in the same surface and coincide. In that case the frequency-doubled radiation is to be separated from the diode laser radiation by means of an additional wavelength-selective element, for example a wavelength-sensitive beam splitter, between the frequency-doubling medium and the folding body, and is to be coupled out of the device.

In each one of said embodiments of the folding body with a grating as a feedback element it is possible to arrange the grating at an acute angle with respect to the surface 125 or 149, as is shown for a grating in FIGS. 21*b* and 21*c* for a folding body in the form of a plane-parallel plate. In fact, the wavelength-resolving power is dependent on the number of grating periods falling within the radiation beam and hence on the diameter of this radiation beam. By tilting the grating with respect to the surface of the glass body, a larger surface of the grating is covered by the same radiation beam and consequently a larger wavelength-resolving power can be achieved.

In each embodiment of the glass body, and both for a grating and an etalon and for a prism as a feedback element, the body can be arranged in the optical device 1 to rotate with respect to the incident beam 15 so that the wavelength to be reflected can be changed.

The above-described devices with a wavelength-selective feedback element are considerably less sensitive to temperature variations than known devices for supplying frequency-raised radiation. The stability of the novel devices is mainly determined by the temperature dependence of the non-linear optical medium. This variation is of the order of 0.05 nm/° C if this medium is constituted by a segmented waveguide of KTP. For an acceptance bandwidth of 0.3 nm of the non-linear optical medium, temperature variations of several degrees Celsius are then allowed.

A relatively large tolerance as to the position of the wavelength-selective feedback element is further allowed. If radiation pulses having a pulse duration of the order of 350 psec and a pulse repetition frequency of 900 MHz are used, which corresponds to a pulse period of approximately 1110 psec, displacements of the feedback element of the order of 10 to 20 mm corresponding to a delay time change of the order of 100 psec will influence the behaviour of the device.

Figure 16:
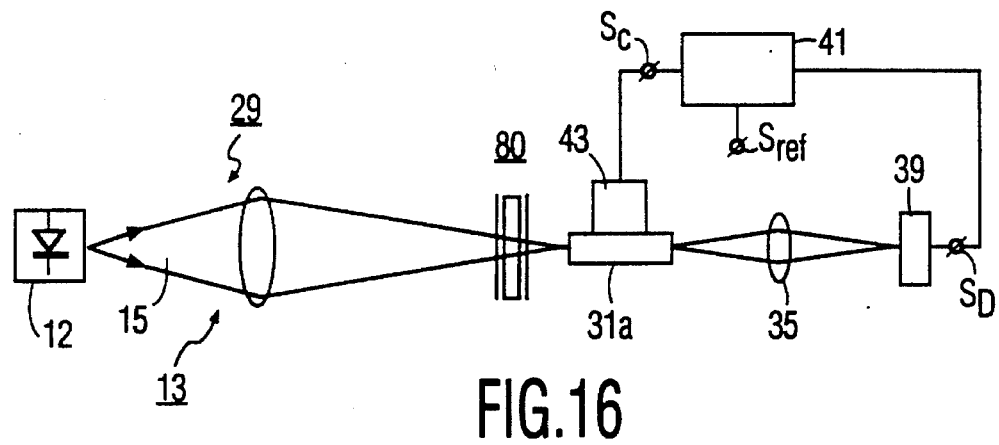
FIGS. 16 and 17 show two embodiments of an optical device according to the invention, in which opto-electronic and optical feedback are combined.

As the desired acceptance bandwidth is smaller, the temperature dependence of the device increases. A further embodiment of the device utilizing this aspect has an opto-electronic feedback in addition to an optical feedback. Such an embodiment is shown in FIG. 16.

A part of the frequency-raised radiation is detected by the detector 39 and its output signal is compared with a reference signal $S_{ref}$ in a comparator 41 which supplies a control signal $S_c$ for the temperature control unit 43 of the non-linear optical medium 31. It is ensured by means of the feedback element 80 that the wavelength of the laser radiation is maintained constant. At larger temperature variations at which the acceptance band of the medium 31 will vary, the acceptance band is corrected via the opto-electronic feedback 39, 41, 43 in such a way that the laser wavelength is within this acceptance band.

The left-hand portion of FIG. 15, which corresponds to FIG. 14, with an etalon as a feedback element is only shown by way of example. The combination of wavelength-selective optical feedback and opto-electronic feedback is also possible if the optical feedback is realised with a grating as is shown in FIGS. 4, 8, 9, 11, 12 and 13.

Figure 17:
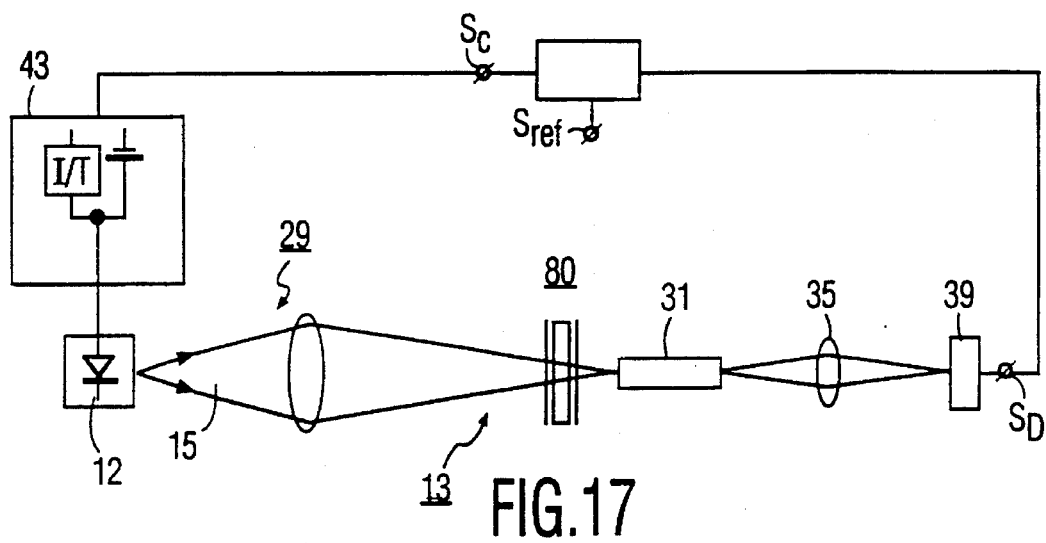

If an etalon is used as a feedback element, the diode laser 12 instead of the non-linear optical medium can be controlled by varying the electric current through or the temperature of this laser. FIG. 17 shows an embodiment of this combination which joins the devices of FIGS. 2 and 16 and does not require any further explanation. This combination only makes sense if the feedback element is an etalon, because the wavelength is then periodically fixed by cooperation of the distance between the two faces of the etalon and the output spectrum of the diode laser. When a grating is used as a feedback element, the laser wavelength is fixed and it does not make sense to use the feedback of FIG. 17, at least not for corrections at large temperature variations. However, when a grating is used, the diode laser current or temperature can be corrected with reference to the detected frequency-doubled radiation so as to obtain a fine tuning between the diode laser wavelength and the acceptance bandwidth of the non-linear optical medium, for example, within the mode distance of the output spectrum of the diode laser.

It is further possible to arrange the grating on a piezo-electric element to which a signal is applied which corresponds to the detected frequency-doubled radiation. The fixed wavelength of the grating can thus be corrected by feedback to the grating angle.

A pulsed laser beam can be obtained by operating the diode laser with a periodically varying electric current. This may be a pulsed current but, for example, also a sinusoidal current. A diode laser having such a structure that it supplies a pulsing beam may alternatively be used. Such a laser, which is commonly referred to as self-pulsing laser, is known from, for example British Patent Application 2 221 094.

Figure 18:
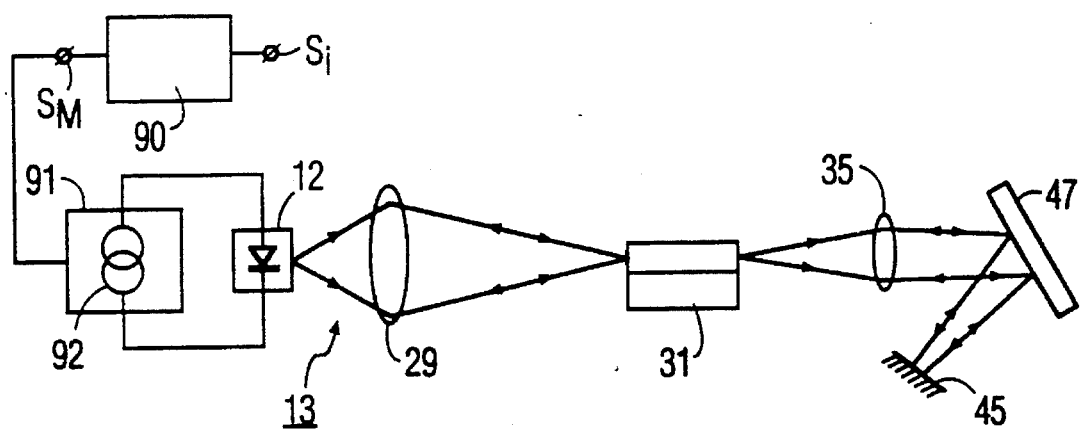
FIGS. 18, 19 and 20 show embodiments of an optical device according to the invention in which the intensity of the frequency-raised radiation is switched.

If the frequency-raised, for example frequency-doubled radiation $R_U$ is used for, for example writing an optical record carrier, it must be possible to switch the intensity of this radiation rapidly, in accordance with the information to be written, between a maximum level at which a change is brought about in the radiation-sensitive layer of the record carrier, and a minimum level at which this does not take place. The present invention provides the possibility of switching the electric current through the diode laser in a different manner than in the known method. A first possibility is to switch the repetition frequency of the electric current and hence that of the laser pulses between a value at which said delay time condition is satisfied and a value at which this condition is no longer satisfied. This possibility is illustrated in FIG. 18. The device shown in this Figure is based on the same principle as that in FIG. 4 and comprises an electronic circuit 90 as an extra component in which the supplied information signal $S_i$ to be written, for example, an audio or video signal is digitized and coded in known manner. The output signal $S_M$ of the circuit 90 is applied to a control circuit 91 for the diode laser 12, which circuit 91 comprises a current source 92 as well as a sub-circuit for switching the repetition frequency between two values in conformity with the series of zeros and ones of the signal $S_M$.

Figure 19:
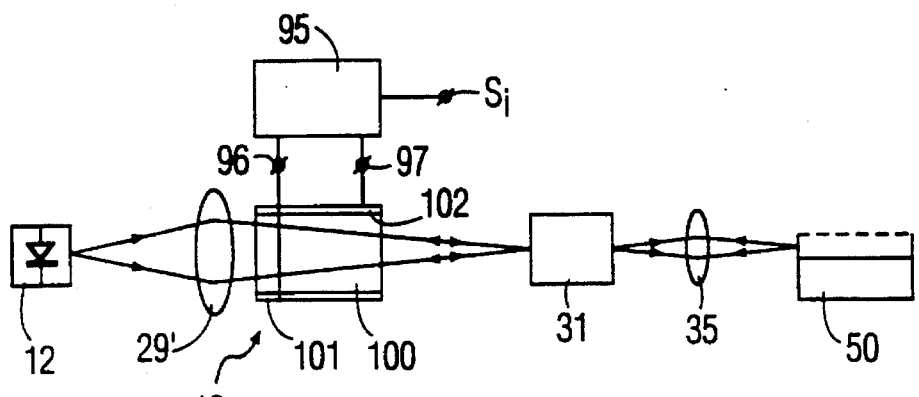

FIG. 19 shows a second possibility of switching the intensity of the frequency-raised radiation between a maximum and a minimum. The device shown in this Figure, which is based on the principle of that of FIG. 8, comprises an electronic circuit 95 for converting the signal $S_i$ to be written into a voltage between the output terminals 96, 97, which voltage is switched between two levels in conformity with the signal $S_i$ to be written. This voltage is applied to the electrodes 101,102 of an electrooptical element so that its refractive index is switched between two values. Thus, the optical path length covered by a radiation pulse from the diode laser 12 to the wavelength-selective reflectors can be switched between a value at which the delay time condition is satisfied, and hence radiation with a raised frequency is generated, and a value at which this is not the case.

Figure 20:
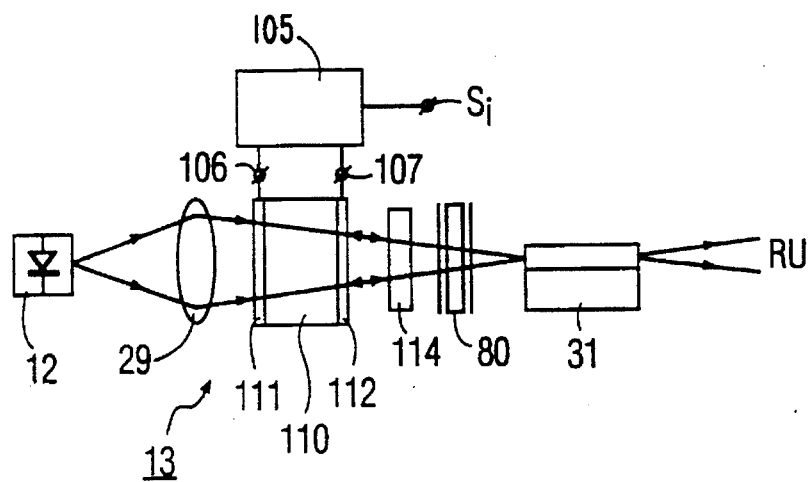

A third possibility of switching the intensity of the frequency-raised radiation is to switch the energy of the radiation pulse returning to the diode laser between a first and a second value which is larger or smaller, respectively, than the energy built up in the diode laser at the instant of return. To this end the device must comprise a reflector having a rapidly adjustable reflection coefficient. Such a reflector may consist of a reflector component having a fixed reflection coefficient in combination with a component whose transmission is adjustable. This component may consist of a liquid crystalline element and a polarization analyzer. In FIG. 20 these elements are denoted by 110 and 114, respectively. The device in accordance with this Figure is based on that of FIG. 14 and comprises an electronic circuit in which the signal $S_i$ to be written is converted into a voltage between the output elements 106 and 107, which voltage is switched between two levels in accordance with the information to be written. This voltage is applied between the electrodes 111, 112 of the liquid crystalline cell 110. The state of polarization of the radiation propagating through the cell is switched by means of this voltage and the analyzer converts the two states of polarization into two intensity levels.

Instead of liquid crystalline material, another electro-optical birefringent material may alternatively be used. The birefringent element and the analyzer may be replaced by a preferably planar interferometer in which the refractive index can be switched electro-optically in at least one of the branches.

A fourth possibility of switching the intensity of the frequency-raised radiation is to switch the refractive index of the non-linear optical medium electro-optically, i.e. by means of an electric field across this medium, between two values. These values are chosen to be such that the acceptance band of the medium associated with the one value comprises the laser wavelength and the acceptance band associated with the other value does not comprise this wavelength.

All of the different possibilities of switching the intensity may be used in the various embodiments of the device. This is illustrated by FIGS. 18, 19 and 20 each showing different embodiments of the device.

As already noted, the choice of the non-linear optical medium depends on the desired acceptance bandwidth. Moreover, the medium may have different shapes. The medium may be a waveguide 31 (FIGS. 2, 3, 8–15, 17, 18, 20) whose radiation-conducting layer comprises a non-linear optical material. Suitable materials are, for example KTP, LiNbO$_3$ or LiTaO$_3$. The medium may also be a non-linear optical crystal 31a (FIGS. 4, 16, 19). Suitable materials are, for example KNbO$_3$ or KLiNbO$_3$. As compared with a waveguide, a crystal has the advantage that coupling in is mechanically more stable. However, a higher conversion efficiency of the diode laser radiation in spite of the loss upon coupling in can be achieved with a waveguide.

The description of the invention is based on an optical apparatus for reading and/or writing an optical disc in which the frequency of the radiation of a diode laser is preferably doubled. The temperature-independent and feedback-insensitive halving of the wavelength realised in accordance with the invention also provides advantages in other apparatuses such as, for example printers and scanners or projection apparatuses for photolithographically manufacturing integrated circuits, liquid crystalline display panels, etc.

Halving the wavelength in, for example printers provides the possibility of using other radiation-sensitive materials which have a greater sensitivity than the materials hitherto used so that less radiation energy is required for printing, or a better printing result can be achieved with the same radiation energy.

The invention is not limited to frequency doubling or wavelength halving, but may also be used for realising another extent of raising the radiation of a radiation source or for obtaining radiation of a given frequency by mixing the radiation of two radiation sources having different frequencies.

We claim:

1. A device for generating a beam of radiation, comprising:

a non-linear optical medium having an acceptance bandwidth, a multimode pulsed laser producing radiation at a plurality of wavelengths, means for directing said radiation into said medium, and feedback means having an active control system comprising a detector producing an output signal responsive to frequency-raised radiation from said medium, and a control unit responsive to said output signal for controlling at least one parameter affecting said pulsed laser so that at least one of said wavelengths or an average value of two of said wavelengths falls within said acceptance bandwidth, and for influencing the quantity of said frequency-raised radiation.

2. An optical device as claimed in claim 1, characterized in that the parameter is the electric current through the diode laser.

3. An optical device is claimed in claim 1, characterized in that the parameter is the temperature of the diode laser.

4. An optical device as claimed in claim 1, characterized in that the diode laser is a self-pulsing diode laser.

5. An optical device as claimed in claim 1, characterized in that the non-linear optical medium comprises a non-linear optical crystal.

6. An optical device as claimed in claim 5, characterized in that the nonlinear optical crystal is KNbO$_3$ or.

7. An optical device as claimed in claim 5, characterized in that the non-linear optical crystal is KLiNbO$_3$.

8. An apparatus for writing information in a radiation-sensitive layer on a carrier, comprising a radiation source unit and an intensity switch for switching the intensity of the beam supplied by the radiation source unit in conformity with the information to be written, characterized in that the radiation source unit is a device as claimed in claim 1 and in that the intensity switch is constituted by means for setting one of the following parameters:

the repetition frequency of the diode laser pulses;

the optical path length of the radiation pulses returning to the diode laser;

the energy of the radiation pulses returning to the diode laser;

the acceptance band of the non-linear optical medium.

9. A device for generating a beam of radiation, comprising:

a non-linear optical medium having an acceptance bandwidth, a multimode pulsed laser producing radiation at a plurality of wavelengths, means for directing said radiation into said medium, and optical wavelength-selective feedback means, receiving frequency-raised radiation from said medium, for controlling at least one of said wavelengths or an average value of two of said wavelengths to fall within said acceptance bandwidth, by reflecting a portion of one pulse of radiation to reenter the laser during the build-up time of a following pulse of radiation.

10. An optical device as claimed in claim 9, characterized in that the wavelength-selective feedback means comprise an at least partially reflecting feedback element which is arranged at a distance d from the diode laser, said distance satisfying the condition $$d = \frac{c}{2} \cdot nT - \frac{c}{2} \cdot \epsilon(p + \Delta p)$$

in which p is the pulse duration of an emitted laser pulse, T is the pulse period, n is an integer, c is the light velocity in a medium traversed by the radiation beam, $\Delta p$ is the build-up time of a pulse LP in the diode laser and e is a real number which satisfies $0<\epsilon<1$ and increases or decreases within these limits at a decreasing or increasing energy $E(P_r)$, respectively, of a radiation pulse reflected by the feedback element so that at the instant when said radiation pulse enters the diode laser the condition $$E(P_r) > E(LP_i)$$

is satisfied, in which $E(LP_i)$ is the radiation energy built up in the diode laser at the relevant instant.

11. An optical device as claimed in claim 10, characterized in that the wavelength-selective feedback means are formed from one element which is both partially reflecting and wavelength-selective.

12. An optical device as claimed in claim 11, characterized in that the element is an etalon.

13. An optical device as claimed in claim 11, characterized in that the element is a partially reflecting grating.

14. An optical device as claimed in claim 9, characterized in that the wavelength-selective feedback means comprise a grating.

15. An optical device as claimed in claim 14, characterized in that the grating is a holographic grating.

16. An optical device as claimed in claim 14, characterized in that the grating is a planar grating which is present in an optical fibre succeeding the medium.

17. An optical device as claimed in claim 14, characterized in that the grating is a planar grating arranged in the medium.

18. An optical device as claimed in any one of claim 9, characterized in that folding means for folding the radiation path are arranged between the diode laser and the feedback means.

19. An optical device as claimed in claim 18, characterized in that the folding means comprise a folding body of optically transparent material having at least two reflecting surfaces and being provided with an entrance window and an exit window, and in that one of the reflecting surfaces is provided with a third window for transmitting the diode laser radiation to and from the feedback means.

20. An optical device as claimed in claim 19, characterized in that the feedback means are integrated in the third window.

21. An optical device as claimed in claim 20, characterized in that for the purpose of changing the wavelength of the radiation reflected towards the diode laser, the folding body is arranged rotatable over a small angle with respect to the radiation beam supplied by the diode laser.

22. An optical device as claimed in claim 19, characterized in that each reflecting surface is provided with a layer having a high reflection coefficient.

23. An optical device as claimed in claim 22, characterized in that the high-reflection layer has a higher reflection coefficient for the radiation supplied by the diode laser and a lower reflection coefficient for the frequency-raised radiation.

24. An optical device as claimed in claim 19, characterized in that the folding body is a plane-parallel plate in which the first reflecting surface and the second reflecting surface are located opposite and parallel to each other.

25. An optical device as claimed in claim 19, characterized in that the folding body is present in a medium having a refractive index which is smaller than that of the body material, in that the folding body has at least two surfaces which totally and internally reflect radiation incident thereon and in that the radiation is reflected at least once by each one of said two surfaces when it traverses a coplanar radiation path in the folding body.

26. An optical device as claimed in claim 19, characterized in that an optical prism is arranged on the entrance window and on the exit window, the surface of said prism, through which a radiation beam enters and leaves the prism, being transverse to the chief ray of the beam.

27. An optical device as claimed in claim 19, characterized in that one of the reflecting surfaces is provided with a fourth window on which a retro-directive element is arranged by which the radiation, after having traversed a first radiation path extending to the reflecting surfaces via a number of reflections, is captured in a first plane within the folding body and is reflected parallel to itself, and re-enters the body so as to traverse at least a second radiation path extending to the reflecting surfaces via a number of reflections in a plane parallel to the first plane.

28. An optical device as claimed in claim 19, in which the feedback means comprise a grating, characterized in that the grating extends at a small angle different from 0° to the third window.

29. An optical device as claimed in claim 9, characterized in that the optical wavelength-selective feedback means are supplemented by an active control system comprising a detector which is sensitive to the frequency-raised radiation and a control unit controlled by the output signal of said detector for influencing at least one parameter determining the quantity of frequency-raised radiation.

30. An optical device as claimed in claim 29, characterized in that the parameter is the electric current through the diode laser and in that the control unit controls said current.

31. An optical device as claimed in claim 29, characterized in that the parameter is the diode laser temperature and in that the control unit controls said temperature.

32. An optical device as claimed in claim 29, characterized in that the parameter is the temperature of the non-linear optical medium and in that the control unit controls its temperature.

33. An optical device as claimed in claim 29, characterized in that the parameter is the refractive index of the non-linear optical medium and in that the control unit controls the magnitude of an electric field across said medium.

34. An optical device as claimed in claim 9, characterized in that the non-linear optical medium comprises a waveguide formed from a non-linear optical material.

35. An optical device as claimed in claim 34, characterized in that the waveguide is formed from KTP.

36. An optical device as claimed in claim 34, characterized in that the waveguide is formed from one of the materials $LiNbO_3$ or $LiTaO_3$.

37. An apparatus for optically scanning an information plane, comprising a radiation source unit, an optical system for focusing the radiation supplied by the radiation source unit to a scanning spot in the information plane, and a radiation-sensitive detection system for convening radiation from the information plane into an electric signal, characterized in that the radiation source unit is constituted by an optical device as claimed in claim 9.

* * * * *